United States Patent
Boutillon et al.

(10) Patent No.: US 11,245,421 B2
(45) Date of Patent: Feb. 8, 2022

(54) CHECK NODE PROCESSING METHODS AND DEVICES WITH INSERTION SORT

(71) Applicant: UNIVERSITE DE BRETAGNE SUD, Lorient (FR)

(72) Inventors: Emmanuel Boutillon, Lorient (FR); Cédric Marchand, Queven (FR); Hassan Harb, Tibnin (LB)

(73) Assignee: UNIVERSITE DE BRETAGNE SUD, Lorient (FR)

( * ) Notice: Subject to any disclaimer, the term of this patent is extended or adjusted under 35 U.S.C. 154(b) by 0 days.

(21) Appl. No.: 17/255,101

(22) PCT Filed: Jul. 4, 2019

(86) PCT No.: PCT/EP2019/068041
§ 371 (c)(1),
(2) Date: Dec. 22, 2020

(87) PCT Pub. No.: WO2020/008006
PCT Pub. Date: Jan. 9, 2020

(65) Prior Publication Data
US 2021/0250047 A1    Aug. 12, 2021

(30) Foreign Application Priority Data
Jul. 5, 2018   (EP) .................................. 18305889

(51) Int. Cl.
*H03M 13/11*    (2006.01)
(52) U.S. Cl.
CPC ...... *H03M 13/1171* (2013.01); *H03M 13/114* (2013.01); *H03M 13/1111* (2013.01)
(58) Field of Classification Search
CPC ................................................ H03M 13/1171
(Continued)

(56) References Cited

U.S. PATENT DOCUMENTS

| 2009/0018335 A1* | 1/2009 | Ishikawa | ................. A61P 35/00 544/236 |
| 2011/0066917 A1* | 3/2011 | Heinrich | ............ H03M 13/1134 714/752 |

(Continued)

FOREIGN PATENT DOCUMENTS

WO    2015104275 A1    7/2015

OTHER PUBLICATIONS

International Search Report and Written Opinion for PCT/EP2019/068041, dated Aug. 30, 2019.
(Continued)

*Primary Examiner* — Fritz Alphonse
(74) *Attorney, Agent, or Firm* — Meagher Emanuel Laks Goldberg & Liao, LLP

(57) ABSTRACT

A sorting device and method for determining elementary check node components in an elementary check node processor implemented in a non-binary error correcting code decoder by sorting auxiliary components are presented. The auxiliary components are stored in a plurality of FIFO memories, each FIFO memory being assigned a FIFO number index. Each auxiliary component stored in a given FIFO memory comprises an auxiliary symbol, a reliability metrics representing the reliability of the auxiliary symbol, and the FIFO number index assigned to the given FIFO memory. The sorting device is configured to sort the auxiliary components by a plurality of multiplexers arranged sequentially. Each multiplexer is configured to initialize a candidate elementary check node component from the components of a FIFO memory corresponding to the auxiliary component which comprise the most reliable auxiliary symbol and to perform one or more iterations of the illustrated receiving, updating and sorting steps.

10 Claims, 5 Drawing Sheets

(58) Field of Classification Search
USPC .............................. 714/752, 749, 755, 758
See application file for complete search history.

(56) References Cited

U.S. PATENT DOCUMENTS

2013/0346883 A1* 12/2013 Shuster ............... G06F 3/04815
715/757
2016/0182087 A1* 6/2016 Sommer ........... H03M 13/2975
714/752
2021/0143838 A1* 5/2021 Marchand ........... H03M 13/658

OTHER PUBLICATIONS

Oussama Abassi et al: "A Novel Architecture for Elementary-Check-Node Processing in Nonbinary LDPC Decoders", IEEE Transactions on Circuits and Systems II: Express Briefs, vol. 64. No. 2, Feb. 1, 2017 (Feb. 1, 2017). pp. 136-140.
E. Boutillon, et al., "Design of a GF(64)-LDPC decoder based on the EMS algorithm," IEEE Transactions on Circuits and Systems I: Regular Papers, vol. 60, No. 10, pp. 2644-2656, Oct. 2013.
Xinmiao Zhang et al: "Efficient Partial-Parallel Decoder Architecture for Quasi-Cyclic Nonbinary LDPC Codes", IEEE Transactions on Circuits and Systems I: Regular Papers. IEEE. US, vol. 58, No. 2, Feb. 1, 2011 (Feb. 1, 2011), pp. 402-414.
L. Barnault and D. Declercq, "Fast decoding algorithm for LDPC over GF(q)", In Proceedings of IEEE Information Theory Workshop, pp. 70-73, Apr. 2003.
V. Savin, "Min-max decoding for non-binary LDPC codes", In Proceedings of IEEE International Symposium on Information Theory, pp. 960-964, Jul. 2008.
D. Declercq et al, "Decoding algorithms for non-binary LDPC codes over GF", IEEE Transactions on Communications, vol. 55, No. 4, pp. 633-643, Apr. 2007.
Lacruz, F. et al., "One Minimum Only Trellis Decoder for Non-Binary Low-Density Parity-Check Codes", in IEEE Transactions on Circuits and Systems I: Regular Papers, vol. 62, No. 1, pp. 177-184, Jan. 2015.
E. Li, et al., "Low latency T-EMS decoder for non-binary LDPC codes" 2013 Asilomar Conference on Signals, Systems and Computers, Pacific Grove, CA, 2013, pp. 831-835.
C. Marchand et al., Extended-Forward Architecture for Simplified Check Node Processing in NB-LDPC Decoders, SIPS'2017, France.
P. Schlafer, N. When, M. Alles, T. Lehnigk-Emden, and E. Boutillon, Syndrome based check node processing of high order NB-LDPC decoders, In Proceedings of the International Conference on Telecommunications, pp. 156-162, Apr. 2015.
P. Schlafer, et al., A new Architecture for High Speed, Low Latency NB-LDPC Check Node Processing, In Proceedings of IEEE International Symposium on Personal, Indoor and Mobile Radio Communications, Aug. 2015.
E. Boutillon and L. Conde-Canencia, Bubble check: a simplified algorithm for elementary check node processing in extended min-sum non-binary LDPC decoders, Electronics Letters, vol. 46, No. 9, pp. 633-634, Apr. 2010.

* cited by examiner

CHECK NODE PROCESSING METHODS AND DEVICES WITH INSERTION SORT

TECHNICAL FIELD

The invention generally relates to digital communications, and in particular to methods and devices for decoding a signal encoded using an error correcting code.

BACKGROUND

Error correcting codes are implemented in several data processing and storage devices and systems, to provide a reliable and error-free transmission, as well as to allow reliable storage of data in the presence of noise and/or interference.

Exemplary applications in which error correcting codes are used comprise voice and multimedia transmission for instance in wireless ad-hoc networks (e.g. standardized in W-Fi™ 802.11), in radio communication systems (e.g. in 3G, 4G/LTE, 5G and the like, etc.), in optical communication systems, and in digital video broadcasting (e.g. standardized in DVB-C2, DVB-S2X, and DVB-T2).

Error correcting codes can be categorized into two classes: linear codes and non-linear codes. Linear error correcting codes are particularly advantageous given their low implementation complexity compared with the non-linear codes. Exemplary linear error correcting codes comprise convolutional codes and linear block codes such as Hamming codes, Reed-Solomon codes, Turbo codes, Polar codes, and Low-Density Parity-Check (LDPC) codes.

LDPC codes have proved to be very efficient codes. In particular, non-binary LDPC codes provide transmission rates proven to approach the maximum amount of information that can be transmitted over a transmission channel. Non-binary LDPC codes provide high-spectral efficiency coding and perform better than binary LDPC codes.

Given the linear structure of linear error correcting codes, iterative message passing algorithms can be used in receiver devices for decoding signals encoded using linear error correcting code(s).

Message passing algorithms use a graph representation of the code used to decode data, called 'Tanner graph'. The Tanner graph comprises two sets of nodes referred to as 'variable nodes' and 'check nodes'. Each variable node is associated with a column of the parity-check matrix of the code. Each check node is associated with a row of the parity-check matrix, i.e. with a parity-check equation. Variable nodes and check nodes are connected via edges. The connections between variable nodes and check nodes are determined by the non-zero entries of the parity-check matrix.

The variable nodes and the check nodes form processing units. Message passing algorithms are based on exchanging messages representative of the encoded data between the check node processing units and the variable node processing units associated with the graph representation of the code used to encode data. The decoding process comprises variable node update by computing variable node messages, check node update by computing check node messages, and codeword decision making. Each check node message and variable node message comprises one or more components, a component comprising a symbol and a reliability metrics associated with the symbol.

Exemplary decoding algorithms for non-binary codes, such as non-binary LDPC codes, comprise:

the 'q-aray sum-product' algorithm disclosed for example in "L. Barnault and D. Declercq, Fast decoding algorithm for LDPC over GF(q), In Proceedings of IEEE Information Theory Workshop, pages 70-73, April 2003";

the 'min-max' algorithm disclosed for example in "V. Savin, Min-max decoding for non-binary LDPC codes, In Proceedings of IEEE International Symposium on Information Theory, pages 960-964, July 2008";

the 'extended min-sum' (EMS) algorithm disclosed for example in "D. Declercq and M. Fossorier, Decoding algorithms for non-binary LDPC codes over GF, IEEE Transactions on Communications, vol, 55, no. 4, pages 633 643, April 2007", and the 'Trellis EMS decoder' (T-EMS) disclosed for examples in "J. O. Lacruz, F. García-Herrero, J. Valls and D. Declercq, One Minimum Only Trellis Decoder for Non-Binary Low-Density Parity-Check Codes, in IEEE Transactions on Circuits and Systems I: Regular Papers, vol. 62, no. 1, pages 177-184, Jan. 2015" and "E. Li, F. García-Herrero, D. Declercq, K. Gunnam, J. O. Lacruz and J. Valls, "Low latency T-EMS decoder for non-binary LDPC codes," 2013 Asilomar Conference on Signals, Systems and Computers, Pacific Grove, Calif., 2013, pp. 831-835".

The EMS algorithm is based on logarithmic-scale computations for reducing the computational complexity by transforming product operations to simple summation operations.

The largest complexity of the EMS algorithm is the computation performed at the check node processing units. In order to further alleviate the computational complexity and memory requirements at check node processing units, the EMS algorithm applies also a sorting and truncation operations to the variable node messages and the check node messages. Message sorting is performed according to an order of the reliability metrics associated with the symbols comprised in a given message (variable node or check node message). Message truncation is performed for retaining a predefined number of the most reliable symbols comprised in a given message (variable node message or check node message).

The computation of check node messages at the level of the check node processing units can be performed according to various architectures. Existing check node architectures include 'syndrome-based architectures', 'forward-backward architectures', and a recent architecture referred to as 'extended forward architecture' disclosed in "C. Marchand et al., Extended-Forward Architecture for Simplified Check Node Processing in NB-LDPC Decoders, SIPS'2017, France".

Using a syndrome-based architecture, a check node processing unit computes the check node messages by performing two steps. A first step is dedicated to the computation of a set of values termed 'syndromes' from all the received variable node messages. The aim of the second step is to generate check node message(s) from the computed set of syndromes. A decorrelation operation is thus performed in association with each check node message to be delivered to a given variable node processing unit. The decorrelation operation consists in cancelling, from the computed syndromes, the contribution of the variable node message previously received from the variable node processing unit that is configured to receive the computed check node message. The syndrome-based architecture is disclosed in "P. Schlafer, N. When, M. Alles, T. Lehnigk-Emden, and E. Boutillon, Syndrome based check node processing of high order NB-LDPC decoders, In Proceedings of the International Conference on Telecommunications, pages 156-162, April 2015" and "P. Schlafer, et al., A new Architecture for High Speed, Low Latency NB-LDPC Check Node Processing, In Proceedings of IEEE International Symposium on Personal, Indoor and Mobile Radio Communications, August 2015".

Syndrome-based architectures allow parallel computation, which is particularly advantageous for decoding codes constructed over high-order Galois fields. However, with such architectures, the computational complexity is dominated by the number of computed syndromes which increases as the number of the received variable node messages increases.

In forward-backward architectures, the computations performed by a check node processing unit are divided up into multiple elementary calculations involving multiple elementary check node processing units (hereinafter referred to as 'elementary check node processors'), each elementary check node processor being configured to determine an elementary check node message from a first message and a second message derived from the received variable node messages. The check node messages are constructed/determined recursively from the elementary check node messages determined by the elementary check node processors.

The role of an elementary check node processor implemented in the forward-backward architectures is to determine, among all the possible combinations of the components comprised in the first and second messages, a predefined number of components comprising the symbols that are the most reliable and all different from one another. Accordingly, an elementary check node processor determines an elementary check node message by applying a calculation operation followed by a sorting operation and a redundancy elimination operation. During the calculation operation, the elementary check node processor determines auxiliary components (also referred to as 'bubbles') by applying addition operations to the symbols and the reliability metrics comprised in the components of the first and second messages. The aim of the sorting operation is to sort the auxiliary components, according to the reliability of the symbols comprised therein. The aim of the redundancy elimination operation is to retain, among the auxiliary components that comprise redundant symbols, the auxiliary components comprising the most reliable of the redundant symbols.

Early works on the design of elementary check node processors comprise the Bubble check algorithm disclosed in "E. Boutillon and L. Conde-Canencia, Bubble check: a simplified algorithm for elementary check node processing in extended min-sum non-binary LDPC decoders, Electronics Letters, vol. 46, no. 9, pp. 633 634, April 2010".

The number of the possible combinations of the components comprised in the first and second messages may induce a high complexity for the sorting and redundancy elimination operations. Recent algorithms for elementary check node processors have been designed to deal with this complexity issue, including:

the 'L-Bubble check' algorithm disclosed in "E. Boutillon, L. Conde-Canencia, and A. Al Ghouwayel, Design of a GF(64)-LDPC Decoder based on the EMS algorithm, IEEE Transactions on Circuits and Systems, vol. 60, no. 10, pages 2644-2656, October 2013", and the 'S-Bubble check' algorithm disclosed in "O. Abassi, L. Conde-Canencia, A. Al Ghouwayel, and E. Boutillon, A Novel Architecture For Elementary Check Node Processing In Non-Binary LDPC Decoders, IEEE Transactions on Circuits and Systems II: Express Briefs, vol. 64, no. 2, pages 136-140, 2017".

The L-Bubble and S-Bubble algorithms are based both on a matrix representation of the elementary check node processing and on a reduction of the number of combinations of the components of the first and second messages considered for determining the components of an elementary check node message. Elements of the matrix correspond to the auxiliary components (Bubbles). The totality of the matrix elements correspond to all the possible combinations of the components of the first and second messages. The L-Bubble algorithm reduces the complexity of the sorting and redundancy elimination operations by reducing the auxiliary components processed during the sorting and redundancy elimination operations to the bubbles comprised in the first two lines and the first two columns of the matrix representing the elementary check node processing. The S-Bubble algorithm is a variant of the L-Bubble algorithm in which the paths representing the order of the selection of the auxiliary components in the matrix representing the elementary check node processing are optimized, enabling the simplification of the hardware design of the elementary check node processor.

According to the extended-forward architecture, multiple elementary check node processors are used for the calculation of the syndromes, taking thus advantage of the parallelization benefits of the syndrome-based architecture and the linear complexity of the elementary check node processing. For reaching optimal performance using this architecture, the elementary check node processors may not perform redundancy elimination operation. This step may be applied after the decorrelation operation.

Compared with other existing iterative decoding algorithms, the EMS algorithm gives a good trade-off between hardware complexity and communication performance. In particular, the use of elementary check node processing for dividing the processing into multiple computations can advantageously provide high rates and low cost designs of check node processing units. Reaching such performance requires further the reduction of the computational operations involved in the elementary check node processing, essentially the complexity of the sorting operation.

There is accordingly a need for developing low-complexity architectures for elementary check node processors implemented in check node processing units, for decoding signals encoded using non-binary linear error correcting codes in general, and non-binary LDPC codes in particular.

SUMMARY

In order to address these and other problems, there is provided a sorting device for determining elementary check node components in an elementary check node processor implemented in a non-binary error correcting code decoder by sorting auxiliary components, the auxiliary components being stored in a plurality of FIFO memories, each FIFO memory being assigned a FIFO number index, each auxiliary component stored in a given FIFO memory comprising an auxiliary symbol, an auxiliary reliability metrics representing the reliability of the auxiliary symbol, and the FIFO number index assigned to the given FIFO memory. the sorting device comprises a plurality of multiplexers arranged sequentially, the multiplexers being configured to initialize a set of candidate elementary check node components, each candidate elementary check node component being determined from one of the FIFO memories and corresponding to the auxiliary component which comprises the most reliable auxiliary symbol among the auxiliary components stored in the FIFO memory. The candidate elementary check node components are sorted according to the reliability metrics of the auxiliary symbols. Each multiplexer 34-$m$ is configured to perform one or more iterations of the following steps:

receive an auxiliary component extracted from the FIFO memory which is assigned the FIFO number index comprised in the candidate elementary check node component determined at the previous iteration which comprises the most reliable candidate symbol, and update the candidate elementary check node component determined at the previous iteration by selecting one component among the received auxiliary component, the candidate elementary check node component determined at the previous iteration by the multiplexer 34-$m$, and the candidate elementary check node component determined at the previous iteration by the subsequent multiplexer 34-($m$+1).

The sorting device is configured to determine, at each of the one or more iterations, an elementary check node component by selecting the candidate elementary check node component which comprises the most reliable candidate symbol.

According to some embodiments, the elementary check node processor may be configured to receive a first message and a second message derived from two or more variable node messages, the elementary check node processor comprising a calculation unit configured to determine the auxiliary components from the first message and the second message.

According to some embodiments, the first message comprises a first given number of components and the second message comprises a second given number of components, each component of the first message and the second message comprising a symbol and a reliability metrics associated with the symbol, the calculation unit being configured to determine each auxiliary component among the auxiliary components from a component comprised in the first message and a component comprised in the second message, the calculation unit being configured to:

determine the auxiliary symbol comprised in each auxiliary component by applying a first addition operation over an algebraic structure of construction of the non-binary error correcting code, the first addition operation being applied to a symbol comprised in a component of the first message and a symbol comprised in a component of the second message;

determine the auxiliary reliability metrics associated with each auxiliary symbol by applying a second addition operation over a predefined algebraic structure, the second addition operation being applied to a reliability metrics associated with a symbol comprised in a component of the first message and a reliability metrics associated with a symbol comprised in a component of the second message.

The auxiliary components stored in each FIFO memory may be sorted according to a decreasing reliability of the auxiliary symbols.

According to some embodiments, the predefined algebraic structure may be chosen in a group comprising the field of real numbers, the field of integer numbers, and the field of natural numbers.

According to some embodiments, the first given number of components and the second given number of components may be equal.

According to other embodiments, the first given number of components and the second given number of components may be different.

According to some embodiments in which the elementary check node processor is implemented in a check node processing unit configured to exchange two or more variable node messages with at least one variable node processing unit implemented in the non-binary error correcting code decoder during a number of message exchange iterations, the elementary check node processor may be configured to previously determine the number of the auxiliary components depending on at least one parameter chosen in a group comprising the number of message exchange iterations, an algebraic structure of construction of the non-binary error correcting code, a signal-to-noise ratio, one or more of a first predefined number of components of the first message or a second predefined number of components of the second message, and a position of the elementary check node processor within the check node processing unit.

According to some embodiments, a candidate elementary check node component may comprise a candidate symbol and a candidate reliability metrics associated with the candidate symbol, each multiplexer 34-$m$ being associated with a reliability metrics comparator 36-$m$ configured to perform a comparison between the auxiliary reliability metrics comprised in the received auxiliary component and the candidate reliability metrics comprised in the candidate elementary check node component determined by the multiplexer 34-$m$ at a previous iteration, each multiplexer 34-$m$ being configured to perform a control action for selecting a component among the received auxiliary component and the candidate elementary check node components determined at a previous iteration by the multiplexer 34-$m$ and the subsequent multiplexer 34-($m$+1) depending on the comparison performed by the reliability metrics comparator 36-$m$ associated with the multiplexer 34-$m$ and the comparison performed by the reliability metrics comparator 36-($m$+1) associated with the subsequent multiplexer 34-($m$+1).

According to some embodiments, each multiplexer 34-$m$ may be configured to:

perform a keeping action by setting the candidate elementary check node component to the candidate elementary check node component determined by the multiplexer 34-$m$ at a previous iteration if it is determined that the auxiliary symbol comprised in the received auxiliary component is more reliable than the candidate symbol comprised in the candidate elementary check node component determined at the previous iteration by the multiplexer 34-$m$;

perform an insertion action by setting the candidate elementary check node component to the received auxiliary component if it is determined that the auxiliary symbol comprised in the auxiliary component is less reliable than the candidate symbol comprised in the candidate elementary check node component determined by the multiplexer 34-$m$ at a previous iteration and that the auxiliary symbol is more reliable than the candidate symbol comprised in the candidate elementary check node component determined by the subsequent multiplexer 34-($m$+1) at a previous iteration;

perform a shift action by setting the candidate elementary check node component to the candidate elementary check node component determined by the subsequent multiplexer 34-($m$+1) at a previous iteration if it is determined that the auxiliary symbol comprised in the received auxiliary component is more reliable than the candidate symbol comprised in the candidate elementary check node component determined by the subsequent multiplexer 34-(m+1) at a previous iteration.

There is also provided a sorting method for determining elementary check node components in an elementary check node processor implemented in a non-binary error correcting code decoder by sorting auxiliary components, the auxiliary components being stored in a plurality of FIFO memories (33-n), each FIFO memory (33-n) being assigned a FIFO number index. Each auxiliary component stored in a given FIFO memory comprises an auxiliary symbol, an auxiliary reliability metrics representing the reliability of the auxiliary symbol, and the FIFO number index assigned to the given FIFO memory. The sorting method comprises performing, by a plurality of multiplexers (34-m), initialization of a set of candidate elementary check node components, each candidate elementary check node component being determined from one of the FIFO memories and corresponding to the auxiliary component which comprises the most reliable auxiliary symbol among the auxiliary components stored in the FIFO memory. The candidate elementary check node components are sorted according to the auxiliary reliability metrics of the auxiliary symbols. The method comprises performing, by each multiplexer (34-m), one or more iterations of the following steps:

receiving an auxiliary component extracted from the FIFO memory (33-n) which is assigned the FIFO number index comprised in the candidate elementary check node component determined at the previous iteration which comprises the most reliable candidate symbol, and updating the candidate elementary check node component determined at the previous iteration by selecting one component among the received auxiliary component, the candidate elementary check node component determined at the previous iteration by the multiplexer 34-m, and the candidate elementary check node component determined at the previous iteration by the subsequent multiplexer 34-(m+1);

The method further comprises determining, at each of the one or more iterations, an elementary check node component by selecting the candidate elementary check node component which comprises the most reliable candidate symbol.

Advantageously, the sorting operation according to the various embodiments of the invention enables latency and complexity reduction compared with existing techniques, notably when considering a large number of bubbles.

Advantageously, the complexity of the proposed sorting operation is linear as a function of the number of the sorted bubbles and its latency does not depend on the number of sorted bubbles.

Advantageously, the sorting operation according to the various embodiments of the invention enables decoding signals, which have been encoded using non-binary error correcting codes, with reduced critical paths.

Further advantages of the present invention will become clear to the skilled person upon examination of the drawings and the detailed description below.

BRIEF DESCRIPTION OF DRAWINGS

The accompanying drawings, which are incorporated in and constitute a part of this specification, illustrate various embodiments of the invention together with the general description of the invention given above, and the detailed description of the embodiments given below.

DETAILED DESCRIPTION

Embodiments of the present disclosure provide devices, methods, and computer program products for decoding a signal encoded using a non-binary error correcting code with a low computational complexity and a low latency. In particular, they provide efficient reduced-latency and reduced-complexity architectures for elementary check node processors implemented in check node processing units, used in iterative message passing decoders for decoding signals encoded using a non-binary error correcting code.

Methods, devices and computer program products according to the various embodiments as disclosed may be implemented in several types of digital data transmission and storage devices and systems used in several types of applications. Exemplary devices and systems comprise, but are not limited to, computers, disks, laptops, phones, smartphones, recorders, base stations, drones, satellites, Internet of Things devices (IoT), embedded devices or the like. Exemplary applications comprise magnetic and optical recording, digital television and video broadcasting, digital communications, etc.

The following description of some embodiments of the disclosure will be made with reference to digital communication systems, for illustration purposes only. However, the skilled person will readily understand that the various embodiments of the disclosure may be integrated in other types of systems, used for other applications such as positioning systems, memory and storage systems, and spacecraft systems.

Figure 1:
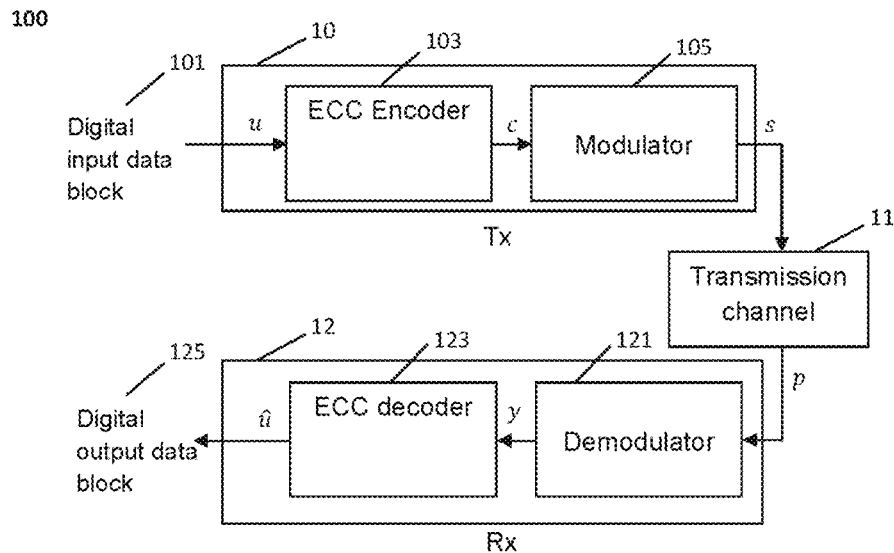
FIG. 1 is a block diagram of an exemplary application of the invention to communication systems, according to some embodiments.

Referring to FIG. 1, there is illustrated an exemplary application of the disclosure in a digital communication system 100. The communication system 100 may be for example:

wired;

wireless (e.g. radio or Visible Light communication systems);

optical (e.g. optical fiber-based, laser-based);

acoustic (e.g. underwater acoustic communication systems);

molecular (used for example in underground structures, e.g. tunnels and pipelines or in underwater environments).

The communication system 100 may comprise at least a transmitter device 10 and a receiver device 12. The transmitter device 10 (also referred to hereinafter as a "transmitter") may be configured to communicate data information to the receiver device 12 (also referred to hereinafter as "receiver") via the transmission channel 11.

In an application of the disclosure to wired communication systems such as computer networking systems, the transmitter 10 and/or receiver 12 may be any device configured to operate in a wired network. Exemplary devices in such applications comprise computers, routers or switches connected to a small or large area wired network. The transmission channel 11 may be in this case any type of physical cable used to ensure the transfer of data between the different connected devices.

In an application of the disclosure to wireless communication systems such as ad-hoc wireless networks, wireless sensor networks, and radio communication systems, the transmitter 10 and receiver 12 may be any type of fixed or mobile wireless device configured to operate in a wireless environment. Exemplary devices in such applications comprise laptops, mobile phones, base stations and any computer device. The transmission channel 11 may be in this case any wireless propagation medium. Further, the transmission channel 11 may accommodate several transmitters 10 and/or several receivers 12. In such embodiments, multiple access techniques and/or network coding techniques may be used in combination with error correcting codes. Exemplary multiple access techniques comprise Time Division Multiple Access (TDMA), Frequency Division Multiple Access (FDMA), Code Division Multiple Access (CDMA), and Space Division Multiple Access (SDMA).

In an application of the disclosure to optical communication systems such as optical fiber-based systems, the transmitter 10 and receiver 12 may be any optical transceiver devices configured to respectively transmit and receive data information propagated over an optical link. The transmission channel 11 may be any optical fiber link designed to carry data over short or long distances. Exemplary applications using optical fiber links over short distances comprise high-capacity networks such as data center interconnections. Exemplary applications using optical fiber links over long distances comprise terrestrial and transoceanic transmissions. In such embodiments, the information symbols conveyed by the transmitter 10 may be carried by optical signals polarized according to the different polarization states of the fiber. The optical signals propagate along the fiber-based transmission channel 11, according to one or more propagation modes, until reaching the receiver 12. Exemplary optical communication systems comprise Polarization Division Multiplexing (PDM) and Mode Division Multiplexing (MDM) systems.

For any type of wired, wireless or optical communication systems, the transmission channel 11 may be any noisy channel. The noise may result from the thermal noise of the system components or the interfering radiation intercepted by antennas. Other exemplary sources of noise comprise switching, manual interruptions, electrical sparks and lightning. In some embodiments, the total noise may be modeled by an Additive White Gaussian Noise (AWGN).

Further, according to some embodiments applied to digital mass storage, the transmission channel 11 may be modeled for example by an erasure channel, a binary symmetric channel, or a Gaussian channel. In such embodiments, the transmission channel 11 may be any type of storage device that can be sent to (written on) and received from (read).

In addition, the transmitter 10 and receiver 12 may be equipped with single or multiple antennas. In particular, in the presence of multiple transmit and/or receive antennas, Space-Time coding and decoding techniques may be used in combination with error correcting coding and decoding.

Further, encoded data may be transmitted over one or multiple frequency bands. When encoded data are transmitted over multiple frequency bands, the modulator 105 may use multi-carrier modulation formats such as OFDM (acronym for Orthogonal Frequency Division Multiplexing) and FBMC (acronym for Filter Bank Multi-Carrier).

According to some embodiments of the disclosure, the transmitter 10 comprises an error correcting code (ECC) encoder 103, configured to encode a digital input data block 101 denoted u using a non-binary error correcting code into a codeword vector denoted c. The receiver 12 may be configured to receive a noisy copy p of the encoded data, or codeword vector, through the transmission channel 11. The receiver 12 may comprise an error correcting code decoder 123 configured to deliver a digital output data block 125 as an estimate û of the original digital input data block 101.

The digital input data 101 may be previously compressed before being encoded by the ECC encoder 103. Any source coding scheme (not shown in FIG. 1) adapted to increase the information throughput may be used to perform the compression. Data encoded by the ECC encoder 103 may be further modulated by a modulator 105. The modulator 105 may be configured to map the encoded data onto an analog signal s and to send it through the transmission channel.

The receiver 12 may comprise homologous processing blocks configured to perform the reverse functions. The receiver 12 may comprise a demodulator 121, configured to generate a signal y, by performing a demodulation of the received signal p from the transmission channel prior to ECC decoding by the ECC decoder 123. The demodulator 121 may be configured to move the received signal or channel output back into baseband and perform low-pass filtering, sampling and quantization. The data decoded by the ECC decoder 123 may be further decompressed using any source decoder (not shown in FIG. 1). The ECC decoder 123 may be configured to implement an iterative decoder (referred to as 'iterative decoding algorithm') involving check node processing units and variable node processing units according to the various embodiments of the disclosure.

The following description of some embodiments of the disclosure will be made with reference to linear block non-binary error correcting codes, for illustration purposes only. However, the skilled person will readily understand that the various embodiments of the disclosure apply to any linear non-binary error correcting codes comprising non-binary convolutional codes.

Accordingly, the ECC encoder 103 may implement a linear block non-binary error correcting code designated by C(n, K); n and K referring respectively to the length of codeword vectors and the length of the encoded data block. The ECC encoder 103 encodes accordingly a data block u of length K into a codeword vector c, with $c=(c_1, \ldots, c_n)$ being a vector of length, comprising n elements of the algebraic structure of construction of the error correcting code C(n, K), also referred to as "symbols".

A linear code C(n, K) may be represented in a matrix form using a generator matrix denoted by G and a parity-check matrix denoted by H. Using a row notation of vectors, the generator matrix G is of dimensions K×n while the parity-check matrix has dimensions of (n−K)×n. The two matrices are linked by the relation $G \cdot H^t = 0$. In addition, entries of both matrices belong to the algebraic structure over which the error correcting code is constructed. Using the matrix representation, any codeword vector c satisfies the equation $c \cdot H^t = 0$. This equation is also called "parity-check equation".

It defines (n−K) parity-check constraints, designed to be satisfied by any codeword vector.

In association with the matrix representation, the linear code C (n, K) may be represented using the Tanner graph denoted by H. This graph comprises n variable nodes and n−K check nodes.

Each variable node $vn \in \{1, 2, \ldots, n\}$ corresponds to a column of the parity-check matrix. Each check node $cn \in \{1, 2, \ldots, n-K\}$ corresponds to a row of the parity-check matrix, i.e. to a parity-check equation. A variable node vn is connected to a check node cn if the entry $H_{vn,cn}$ of the parity-check matrix is equal to a non-null element of the algebraic structure of construction of the code C (n, K).

$H_v(vn)$ denotes the set of the check nodes connected to the variable node vn. Similarly, $H_c(cn)$ denotes the set of the variable nodes connected to the check node cn.

The degree $d_{VN}$ of a variable node vn (respectively $d_{CN}$ of a check node cn) corresponds to the cardinality of the set $H_v(vn)$ (respectively the cardinality of the set $H_c(cn)$).

According to some embodiments, the algebraic structure of construction of the non-binary error correcting code C(n, K) may be any non-zero commutative division ring, such as 'Galois fields'.

The following description of some embodiments will be made with reference to finite fields, for illustration purposes only. However the skilled person will readily understand that the disclosure may be applied to any division rings-like algebraic structures such as non-zero commutative division rings and to any near-rings such as finite division near-rings. Insights on the design of non-binary error correcting codes over finite division near-rings can be found in the article "Non-binary LDPC codes over finite division near rings, 23rd International Conference on Telecommunications (ICT), pp. 1-7, Thessaloniki, 2016".

For non-binary linear codes constructed over Galois Fields, generally denoted by GF(q), where q>2 designates the cardinality of the code, the symbols take values in GF(q). A codeword vector c is thus a vector of n symbols that each belong to GF(q).

The following description of some embodiments will be made with reference to an ECC encoder 103 encoding data using a non-binary LDPC code, for illustration purposes only. However, the skilled person will readily understand that the various embodiments of the disclosure also apply to other non-binary codes such as non-binary polar codes, non-binary convolutional codes, non-binary turbo codes, and in general to non-binary linear block error correcting codes. Non-binary error correcting codes can advantageously be used for high spectral efficiency coding.

For exemplary purposes, in one embodiment, the ECC decoder 123 implements a non-binary LDPC codes decoder for decoding the data encoded by the ECC encoder 103, using a non-binary LDPC code.

The description of the disclosure is made with reference to the EMS algorithm. However, the skilled person will readily understand that the various embodiments apply to any iterative non-binary LDPC codes decoder such as the min-max.

For ease of presentation of the various embodiments of the disclosure, the following definitions will be used in the remaining of the description.

An elementary check node-based architecture refers to any implementation architecture of a check node processing unit that comprises one or more elementary check node processors.

A message generated by a variable node processing unit 27-vn is referred to as a 'variable node message'. A message generated by a check node processing unit 25-cn is referred to as a 'check node message'.

The variable node messages and check node messages may comprise components carrying data representative of the symbols. The components comprised in a variable node message are referred to as 'variable node components' and the components comprised in a check node message are referred to as 'check node components'.

An intrinsic message refers to a message comprising components referred to as intrinsic components, each intrinsic component comprising an intrinsic symbol and an intrinsic reliability metrics associated with the intrinsic symbol. The intrinsic reliability metrics are computed from the received sequence only. The wording 'intrinsic' refers accordingly to the dependence of the intrinsic reliability metrics only on the (transmission) channel.

The first message and the second message processed by an elementary check node processor refer to messages derived from the variable node messages received by the check node processing unit in which the elementary check node processing unit is implemented. The first message comprises a first predefined number of components and the second message comprises a second predefined number of components.

An elementary check node message refers to a message computed by an elementary check node processor from a first message and a second message. The components of an elementary check node message are referred to as elementary check node components.

An auxiliary component (also referred to as 'a bubble') refers to a component determined by an elementary check node processor from a component comprised in a first message and a component comprised in a second message. An auxiliary component comprises an auxiliary symbol and an auxiliary reliability metrics associated with the auxiliary symbol.

A candidate elementary check node component refers to a component determined by an elementary check node processor at a given iteration of the iterative sorting of the auxiliary components performed by said elementary check node processor.

Figure 2:
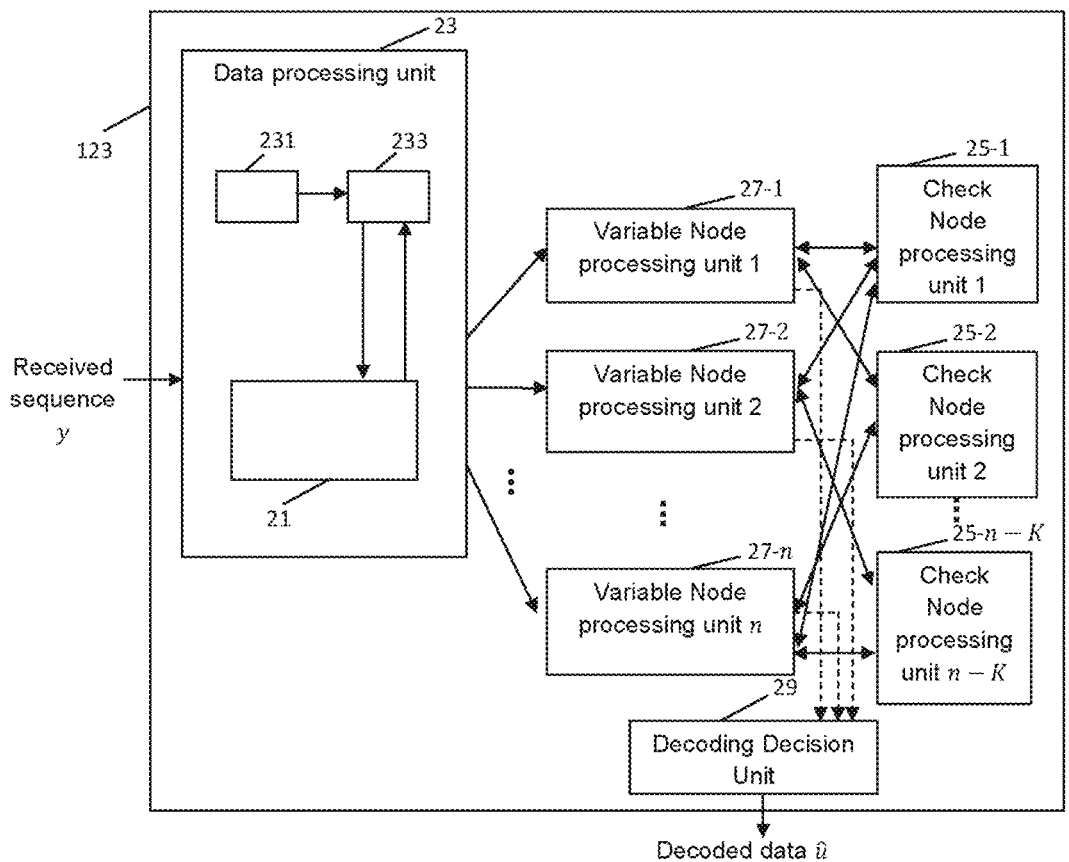
FIG. 2 is a block diagram of a non-binary error correcting code decoder, according to some embodiments in which the EMS decoding algorithm is used.

Referring to FIG. 2, there is illustrated a structure of an iterative non-binary LDPC decoder 123 according to some embodiments using the EMS algorithm.

The iterative decoder 123 may be configured to determine an estimate û of the transmitted codeword c by the transmitter 10 from a received noisy sequence represented by a vector $y=(y_1, \ldots, y_n)$. The codeword $c=(c_1, \ldots, c_n)$ may have been encoded at the transmitter using a non-binary LDPC code designated by C(n,K) constructed over the Galois Field GF(q) with q>2. It may process a signal over several iterations trying, at each iteration, to reduce the remaining errors.

The iterative decoder 123 may be configured to determine the estimate u based on the Tanner graph representation of the code C(n, K) used at the transmitter 10. Each variable node in the Tanner graph maps to a variable node processing unit. Each check node in the Tanner graph maps to a check node processing unit.

Accordingly, the iterative decoder 123 may comprise n variable node processing units 27 (also denoted by 27-1 to 27-*n* or 27-*vn* with vn=1, . . . , n) and n−K check node processing units 25 (also denoted by 25-1 to 25-(*n−K*) or 25-*cn* with cn=1, . . . , n−K).

The variable node processing units 27-*vn* for vn=1, . . . , n and check node processing units 25-*cn* for cn=1, . . . , n−K may be configured to iteratively exchange variable node messages and check node messages during a number of message exchange iterations to estimate the most reliable codeword û from the noisy sequence y.

According to some embodiments, the variable node and check node components comprised respectively in the variable node messages and the check node messages may carry values of the symbols and metrics measuring their reliabilities (also referred to hereinafter as 'reliability metrics'). The value of the reliability metrics is related to the reliability of the symbol. In such embodiments, each variable node message (respectively check node message) may comprise q variable node components (respectively check node components), a component (check node component or variable node component) comprising:

a value of a symbol in GF(q), and
a reliability metrics associated with the symbol.

In some embodiments, the reliability metrics of a symbol may correspond to an estimated probability density function of the symbol which represents the probability that the symbol is correct. In particular, the reliability metrics may be represented in the log-domain by a logarithmic likelihood ratio (LLR) value.

Depending on the expression of the reliability metrics, the most reliable symbols may be associated with the smallest or the greatest values of the reliability metrics.

One definition of the LLR metric involves a fixed symbol denoted by $\beta_i$ and corresponding to the most reliable symbol satisfying:

$$\beta_i = \underset{t=0,\ldots,q-1}{\mathrm{argmax}}\ p(\alpha_t \mid y_i) \quad (1)$$

In equation (1), $\alpha_t$ designates a symbol over the Galois field.

Accordingly, with the hypothesis that the symbols in the Galois field are equiprobable, for the $i^{th}$ symbol $c_i$, the LLR value for this symbol to be equal to $\alpha_t$ is noted $LLR_t(c_i)$ and may be expressed as:

$$LLR_t(c_i) = -\log\left(\frac{p(c_i = \alpha_t \mid y_i)}{p(c_i = \beta_i \mid y_i)}\right) \quad (2)$$

Using such definition of the LLR metrics, the most reliable symbols are those that are associated with the smallest LLR values according to equation (2).

The following description of some embodiments will be made with reference to reliability metrics represented in the logarithm domain by log-likelihood ratio (LLR) values, for illustration purposes only. However, the skilled person will readily understand that other types of decoding and reliability metrics may be used to measure the reliability of symbols. For instance, the reliability metrics may be a quadratic distance or any monotonic function of the probability density function of symbols.

According to some embodiments using the EMS algorithm, the variable node messages and/or the check node messages may be sorted according to their reliability i.e. according to a given order (for example increasing or decreasing) of the reliability metrics comprised in the variable node components and the check node components. Further, the variable node messages may be truncated so as to keep only a predefined number $n_{VN}$ of the variable node components comprising the most reliable symbols, with $n_{VN}$ being strictly lower than q. Similarly, the check node messages may be truncated so as to keep only a predefined number $n_{CN}$ of the check node components comprising the most reliable symbols, with $n_{CN}$ being strictly lower than q. Further, the sorting and truncation operations may be performed by the variable node processing units 27-vn or by the check node processing units 25-cn.

In an embodiment, the predefined number of variable node components $n_{VN}$ and the predefined number of check node components $n_{CN}$ are different, i.e. $n_{VN} \neq n_{CN}$.

In another embodiment, the predefined number of variable node components $n_{VN}$ and the predefined number of check node components $n_{CN}$ are identical, i.e. $n_{VN} = n_{CN}$.

The following description of the embodiments of the disclosure will be made with reference to sorted and truncated variable node messages and check node messages, the number of check node components and variable node components being equal or different.

The processing performed by the various variable node processing units 27-vn and check node processing units 25-cn may be implemented according to several scheduling mechanisms including, without limitation, the three examples described in the following.

According to a first implementation, all the variable node processing units 27-vn for vn=1, . . . , n, are configured to operate in a first round and then all the check node processing units 25-cn, for cn=1, . . . , n–K, may be configured to update the check node messages to be delivered to the variable node processing units in their corresponding sets $H_c(cn)$. This specific scheduling is known as "flooding scheduling". In particular, the check node processing units 25-cn may be configured to operate serially or in parallel, where, from 2 to n–K, check node processing units 25-cn may operate at the same time.

According to a second implementation based on a "horizontal scheduling", the check node processing units 25-cn, for cn=1, . . . , n–K, are configured to operate serially, updating all variable node processing units 27-vn which are connected to them. In particular, a group of check node processing units 25-cn may be configured to operate in parallel, updating all connected variable node processing units 27-vn.

According to a third implementation based on a "vertical scheduling", the variable node processing units 27-vn is configured to operate serially, updating all check node processing units 25-cn which are connected to them.

The exchange of messages may be started by the variable node processing units 27-vn. The variable node messages sent to the check node processing units 25-cn at the start of the decoding process may comprise intrinsic messages.

The iterative decoder 123 may accordingly comprise a data processing unit 23 configured to determine intrinsic symbols and intrinsic reliability metrics from the received sequence, an intrinsic symbol denoted $x \in GF(q)$ and that belongs to the Galois field (in general to the algebraic structure of the non-binary error correcting code) being associated with an intrinsic reliability metrics denoted $I^+(x)$. The intrinsic reliability metrics may be computed from devices external to the error correcting code decoder 123. Intrinsic information can comprise the channel information. Alternatively, in case of concatenated codes, intrinsic information can be obtained from the channel and from the output of distinct decoders.

More specifically, the data processing unit 23 may comprise:
- a symbol generator 231 configured to generate intrinsic symbols x that belong to the algebraic structure over which the non-binary error correcting code is constructed, and
- an intrinsic reliability metrics generator unit 233 configured to generate the intrinsic reliability metrics $I^+(x)$ associated with each intrinsic symbol x from the received sequence y.

Using the LLR notation of equation (2), the intrinsic reliability metrics associated with a symbol x may be determined in logarithmic scale according to:

$$I^+(x) = -\log\left(\frac{p(x = \alpha_t | y_i)}{p(x = \beta_i | y_i)}\right) \quad (3)$$

In equation (3), $\beta_i$ refers to the most reliable symbol previously defined in equation (1).

According to some embodiments, the intrinsic reliability metrics generator unit 233 is configured to load the received signal y from a storage unit 21, the storage unit 21 being configured to store the received signal y.

In some embodiments illustrated in FIG. 2, the storage unit 21 is comprised within the data processing unit 23.

In other embodiments (not illustrated in FIG. 2), the storage unit 21 is comprised in the iterative decoder 123 outside the data processing unit 23.

According to some embodiments, the intrinsic reliability metrics generator unit 233 is configured to determine at least a part of the intrinsic reliability metrics offline before the starting of the iterative decoding process. In such embodiments, the intrinsic reliability metrics generator unit 233 may be further configured to store at least a part of the computed intrinsic reliability metrics in the storage unit 21. Such embodiments may be advantageously implemented for decoding codes constructed over algebraic structures of small order to store all the intrinsic reliability metrics, as computed, in the storage unit 21. For algebraic structures of high orders, only a part of the computed intrinsic reliability metrics may be stored in the storage unit 21.

In some embodiments, the intrinsic reliability metrics generator unit 233 is configured to determine the intrinsic reliability metrics online during the iterative decoding process. Such embodiments may be advantageously implemented for decoding high-order non-binary error correcting codes enabling memorization savings.

In some embodiments, the intrinsic reliability metrics generator unit 233 is configured to determine at least some of the intrinsic reliability metrics offline and to determine the remaining intrinsic reliability metrics online.

According to some embodiments (illustrated in FIG. 2), the iterative decoder 123 comprises a single data processing unit 23 configured to determine intrinsic reliability metrics to be delivered to all of the variable node processing units 27-vn for vn=1, ..., n.

In other embodiments (not illustrated), the iterative decoder 123 comprises a plurality of data processing units 23-vn for vn=1, ..., n, each data processing unit 23-vn being comprised in a variable node processing unit 23-vn, for vn=1, ..., n.

A variable node processing unit 27-vn may be configured to receive intrinsic reliability metrics derived from the received signal y and to receive check node messages from the check node processing units 25-cn corresponding to the set $H_v(vn)$. A variable node processing unit 27-vn may be further configured to process the received check node messages and intrinsic reliability metrics, compute local decisions, and deliver variable node messages to at least one check node processing unit 25-cn corresponding to the check nodes in the set $H_v(vn)$.

Similarly, a check node processing unit 25-cn may be configured to process variable node messages sent by the variable node processing units 27-vn corresponding to the set $H_c(cn)$. A check node processing unit 25-cn may be further configured to deliver check node messages to at least one variable node processing unit 27-vn corresponding to the variable nodes in the set $H_c(cn)$.

The decoding process may terminate either if the processed signal satisfies the parity-check equation or if a maximum number of message exchange iterations is reached without meeting all parity-check constraints.

Accordingly, the iterative decoder 123 may comprise a decoding decision unit 29 configured to receive, at each iteration of the decoding process, the local decisions computed by the variable node processing units 27-vn and to:
- deliver the processed signal as an estimate of the original codeword vector if the processed signal satisfies the parity-check equation; or
- declare a decoding failure but nevertheless output the codeword vector estimated at the last iteration if a maximum number of iterations is reached without meeting all parity-check constraints.

The various embodiments of the disclosure provide efficient low-complexity and low-cost architectures of elementary check node processors implemented in check node processing units 25-cn for cn $\in \{1, \ldots, n-K\}$.

According to the various embodiments of the disclosure, the check node processing unit 25-cn implements one or more elementary check node processors and is configured to determine at least one check node message based on a plurality of elementary computations performed by said one or more elementary check node processors.

Each elementary check node processor implemented in a check node processing unit 25-cn may be configured to:
- receive a first message and a second message derived from the three or more variable node messages received by the check node processing unit 25-cn, and
- to determine an elementary check node message from the first message and second message, the elementary check node message comprising one or more elementary check node components.

According to some embodiments, the iterative decoder 123 may comprise two or more check node processing units 25-cn with cn=1, ..., (n−K), each of said two or more check node processing units 25-cn implementing an elementary check node-based architecture.

The various embodiments of the disclosure provide efficient reduced-complexity and reduced latency techniques for iterative sorting in elementary check node processors.

Figure 3:
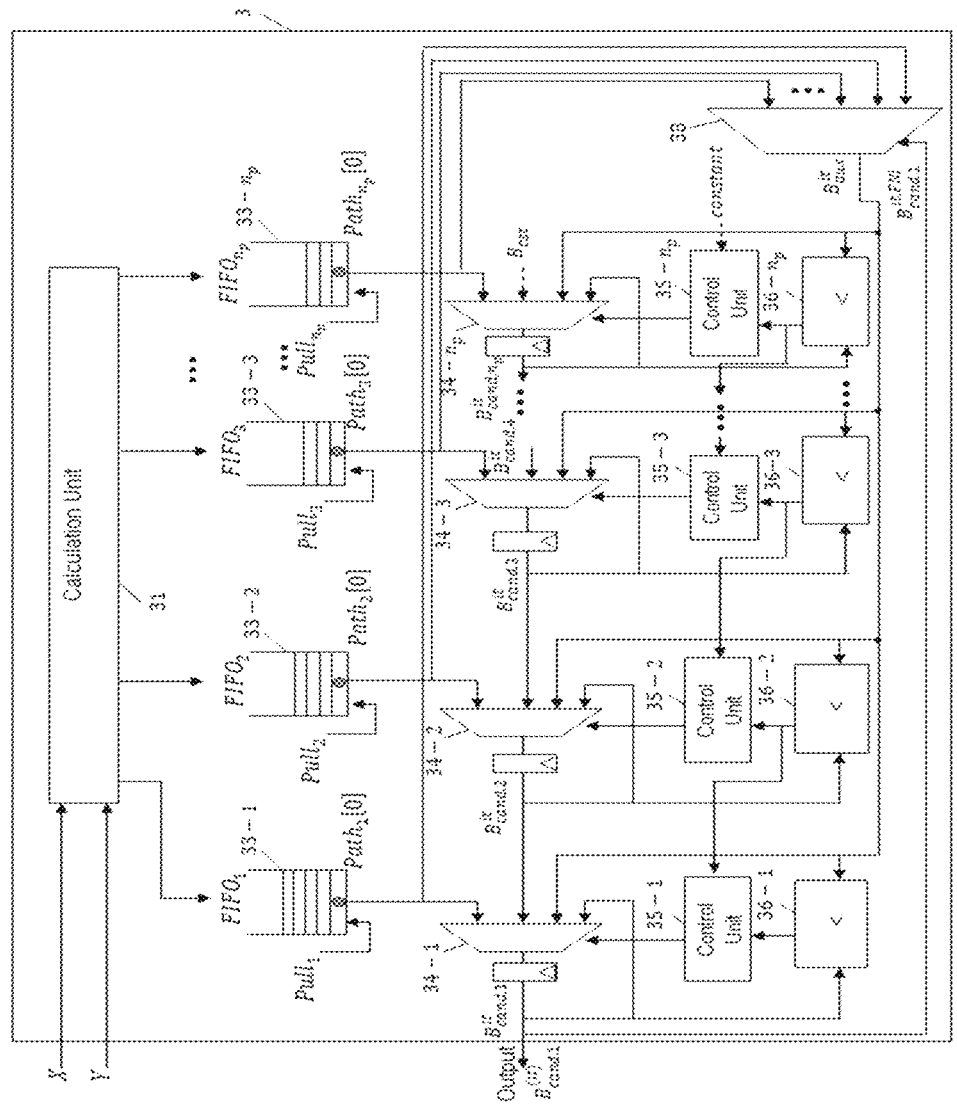
FIG. 3 is a block diagram illustrating the structure of an elementary check node processor implemented in a check node processing unit, according to some embodiments in which the EMS algorithm is used.

FIG. 3 is a block diagram illustrating the structure of an elementary check node processor 3 implemented in a check node processing unit 25-cn of degree $d_{CN} \geq 3$, the check node processing unit 25-cn being accordingly configured to:
- receive $d_{CN} \geq 3$ (three or more) variable node messages denoted by $U_1, \ldots, U_{d_{CN}}$ from the variable node processing units 27-vn in the set $H_c(cn)$, and
- to determine one or more check node messages, denoted by $V_1, \ldots, V_{d_{CN}}$, from the received variable node messages $U_1, \ldots, U_{d_{CN}}$.

According to some embodiments using the EMS algorithm with a sorting and truncation of the check node messages and the variable node messages, each variable node message $U_i$, $i=1, \ldots, d_{CN}$ comprises $n_{VN}$ variable node components denoted by $U_i[j]=(U_i^\oplus[j], U_i^+[j])$ for $j=0, \ldots, n_{VN}-1$, a variable node component $U_i[j]=(U_i^\oplus[j], U_i^+[j])$ comprising a symbol $U_i^\oplus[j]$ that belongs to the Galois field GF(q) and a reliability metrics $U_i^+[j]$ associated with the symbol $U_i^\oplus[j]$. The variable node components may be sorted according to a decreasing reliability corresponding to a given order (increasing or decreasing) of the reliability metrics $U_i^+[j]$ such that $U_i^+[j] \leq U_i^+[j+1]$ (respectively $U_i^+[j] \geq U_i^+[j+1]$) for $j=0, \ldots, n_{VN}-2$ and the component comprising the most reliable symbol is $U_i[0]=(U_i^\oplus[0], U_i^+[0]=0)$ (respectively $U_i[n_{VN}-1]$) for an increasing order (respectively decreasing order) of the reliability metrics.

Similarly, each check node message $V_i$, $i=1, \ldots, d_{CN}$ may comprise $n_{CN}$ check node components denoted by $V_i[l]=(V_i^\oplus[l], V_i^+[l])$ for $l=0, \ldots, n_{CN}-1$, a check node component $V_i[l]=(V_i^\oplus[l], V_i^+[l])$ comprising a symbol $V_i^\oplus[l]$ that belongs to the Galois field GF(q) and a reliability metrics $V_i^+[l]$ associated with the symbol $V_i^\oplus[l]$. The check node components may be sorted according to a decreasing reliability corresponding to a given order (increasing or decreasing) of the reliability metrics $V_i^+[l]$ such that $V_i^+[l] \leq V_i^+[l+1]$ (respectively $V_i^+[j] \geq V_i^+[j+1]$) for $l=0, \ldots, n_{CN}-2$ and the component comprising the most reliable symbol is $V_i[0]=(V_i^\oplus[0], V_i^+[0])$ (respectively $V_i[n_{VN}-1]$) for an increasing order (respectively decreasing order) of the reliability metrics.

Without loss of generality, the following description of some embodiments will be made with reference to a decreasing reliability corresponding to an increasing order of the reliability metrics associated with the symbols, for illustration purposes only.

The elementary check node processor 3 may be configured to receive a first message denoted by X comprising a first given number $n_X$ of components denoted by $X[x]=(X^\oplus[x], X^+[x])$ for $x=0, \ldots, n_X-1$ and to receive a second message denoted by Y comprising a second given number $n_Y$ of components denoted by $Y[y]=(Y^\oplus[y], Y^+[y])$ for $y=0, \ldots, n_Y-1$, the first and the second messages being derived from the variable node messages $U_1, \ldots, U_{d_{CN}}$. Each component of the first message and the second message may comprise a symbol and a reliability metrics associated with the symbol. The components of the first message and the components of the second message may be sorted according to a decreasing reliability corresponding to a given order (increasing or decreasing) of the reliability metrics $X^+[x]$ and $Y^+[y]$ comprised therein such that:

i) $X^+[x] \leq X^+[x+1]$ for $x=0, \ldots, n_X-1$ and $Y^+[y] \leq Y^+[y+1]$ for $y=0, \ldots, n_Y-1$, and that ii) the components comprising the most reliable symbols are respectively $X[0]=(X^\oplus[0], X^+[0]=0)$ and $Y[0]=(Y^\oplus[0], Y^+[0]=0)$.

According to some embodiments, the first message and the second message may comprise a same number of components, according to which the first given number and the second given number are equal, i.e. $n_X=n_Y$.

In another embodiment, the first message and the second message may comprise a different number of components, according to which the first given number and the second given number are different, i.e. $n_X \neq n_Y$.

The elementary check node processor 3 is configured to determine an elementary check node message denoted by E from the first message X and the second message Y, the elementary check node message E comprising $n_E$ elementary check node components denoted by $E[e]=(E[e]^\oplus, E[e]^+)$ for $e=0, \ldots, n_E-1$, each elementary check node component E[e] comprising a symbol $E[e]^\oplus$ and a reliability metrics $E[e]^+$ associated with the symbol, the elementary check node components being sorted according to an increasing order of the reliability metrics $E[e]^+$ such that:

i) $E[e]^+ \leq E[e+1]^+$ for $e=0, \ldots, n_E-2$, and ii) the elementary check node component comprising the most reliable symbol is $E[0]=(E[0]^\oplus, E[0]^+)$.

According to some embodiments, the elementary check node processor 3 may be configured to determine the elementary check node components of the elementary check node message E from auxiliary components derived from combinations of the components comprised in the first message X and the second message Y, the elementary check node processor 3 being configured to determine said elementary check node components by sorting the auxiliary components and selecting the $n_E$ components comprising the most reliable symbols.

Accordingly, as depicted in FIG. 3, the elementary check node processor 3 may comprise:

a calculation unit 31 configured to determine a predefined number $n_B$ of auxiliary components designated by $B_t[x][y]=(B_t[x][y]^\oplus, B_t[x][y]^+)$ for $t=1, \ldots, n_B$ from the first message X and the second message Y. More specifically, the auxiliary component denoted by $B_t[x][y]=(B_t[x][y]^\oplus, B_t[x][y]^+)$ for $t=1, \ldots, n_B$ refers to the auxiliary component determined from the component $X[x]=(X[x]^\oplus, X[x]^+)$ comprised in the first message X and from the component $Y[y]=(Y[y]^\oplus, Y[y]^+)$ comprised in the second message, the index x varying in $0,1, \ldots, n_x-1$ and the index y varying in $0,1, \ldots, n_Y-1$. The auxiliary component $B_t[x][y]=(B_t[x][y]^\oplus, B_t[x][y]^+)$ is a component comprising:

an auxiliary symbol designated by $B_t[x][y]^\oplus$, and an auxiliary reliability metrics designated by $B_t[x][y]^+$ associated with the auxiliary symbol.

The maximum possible number of auxiliary components may be given by the total number of the possible combinations of the components comprised in the first message and of the components comprised in the second message. The maximum possible number of auxiliary components may be equal to $n_X \times n_Y$.

The predefined number of auxiliary components $n_B$ may vary between a predefined number $n_E$ of elementary check node components and the maximum possible number of auxiliary components $n_X \times n_Y$. In other words, the predefined number $n_B$ of auxiliary components may be higher than or equal to the predefined number of elementary check node components $n_E$ and lower than or equal to the maximum number of auxiliary components, that is $n_E \leq n_B \leq n_X \times n_Y$.

According to some embodiments, the calculation unit 31 may be configured to:

determine the auxiliary symbol $B_t[x][y]^\oplus$ comprised in each auxiliary component $B_t[x][y]$ for $t=1, \ldots, n_B$ by applying a first addition operation over the algebraic structure of construction of the non-binary error correcting code, the first addition operation being applied to a symbol $X[x]^\oplus$ comprised in a component $X[x]=(X[x]^\oplus, X[x]^+)$ of the first message X and a symbol $Y[y]^\oplus$ comprised in a component Y[y] of the second message Y according to:

$$B_t[x][y]^\oplus = X[x]^\oplus \oplus Y[y]^\oplus \qquad (4)$$

For error correcting codes constructed over Galois fields, the first addition operation of equation (4) is performed over the Galois field GF(q).

determine the auxiliary reliability metrics $B_t[x][y]^+$ associated with each auxiliary symbol $B_t[x][y]^\oplus$ by applying a second addition operation over a predefined algebraic structure chosen in a group comprising the field of real numbers, the field of integer numbers, and the field of natural numbers, the second addition operation being applied to a reliability metrics $X[x]^+$ associated with a symbol $X[x]^\oplus$ comprised in a component $X[x]$ of the first message X and a reliability metrics $Y[y]^+$ associated with a symbol $Y[y]^\oplus$ comprised in a component $Y[y]$ of the second message Y according to:

$$B_t[x][y]^+ = X[x]^+ + Y[y]^+ \quad (5)$$

According to some embodiments, the elementary check node processor 3 may be configured to previously determine the predefined number $n_B$ of auxiliary components depending on at least one parameter chosen in a group comprising:
  the number of iterations of the messages exchanged between the check node processing unit 25-$cn$ and at least one variable node processing unit 27-$vn$ in the set $H_c(cn)$,
  the algebraic structure of construction of the non-binary error correcting code (for example the Galois field for codes constructed over Galois fields),
  a signal-to-noise ratio,
  one or both of the first predefined number of components $n_X$ of the first message X and the second predefined number of components $n_Y$ of the second message Y, and
  the position of the elementary check node processor 3 within the check node processing unit 25-$cn$.

In some embodiments, the components of the first message and the second message may be received by the calculation unit 31 in serial such that at each clock cycle one component of the first message or one component of the second message is received.

In such embodiments, the calculation unit 31 may be configured to determine the $n_B$ auxiliary components depending on the received components of the first message and the components of the second message. For example, the calculation unit 31 may be configured to compute auxiliary components $B_t[0][y]$ derived from the component $X[0]$ of the first message and the components $Y[y]$ comprised in the second message for each y varying in $0,1,\ldots,n_Y-1$. In this example, the calculation unit 31 may be configured to store the component $X[0]$ of the first message, in response to receiving the component $X[0]$ in a register (not shown in FIG. 3), and determine at each clock cycle an auxiliary component $B_t[0][y]$ in response to receiving a component $Y[y]$ comprised in the second message. The computation of the auxiliary components may accordingly depend on the order of reception of the components of the first message and of the second message.

The serial computation of the auxiliary components depending on the order of reception of the components of the first message and the components of the second message enables grouping the computed auxiliary components into a plurality of $n_p$ paths denoted by $Path_1, \ldots, Path_{n_p}$ such that each path $Path_n = (Path_n[0], \ldots, Path_n[N_n-1])$ for $n=1, \ldots, n_p$ comprises at least one auxiliary component denoted by $Path_n[g] = (Path_n^\oplus[g], Path_n^+[g])$ for $g=0, \ldots, N_n-1$.

The auxiliary components may be grouped into the paths according to a decreasing reliability of the auxiliary symbols such that:
  the auxiliary components comprised in each path of index n are sorted according to a decreasing reliability of the auxiliary symbols satisfying $Path_n^+[g] \leq Path_n^+[g+1]$ for $g=0, \ldots, N_n-1$ and the auxiliary components comprising the most reliable auxiliary symbol of each path are sorted according to a decreasing reliability of the auxiliary symbols such that $Path_1^+[0] \leq Path_2^+[0] \leq \ldots \leq Path_{n_p}^+[0]$.

According to some embodiments, as depicted in FIG. 3, the auxiliary components of each path $Path_n$ constructed during the computation of the auxiliary components may be stored in a FIFO memory 33-$n$ for $n=1, \ldots, n_p$, each FIFO memory 33-$n$ being assigned a FIFO number index denoted by FNI given by the index n varying between 1 and $n_p$ and the auxiliary components stored in each FIFO memory 33-$n$ being assigned the FIFO number index of the FIFO memory 33-$n$ in which they are stored. The auxiliary components stored in a FIFO memory 33-$n$ are denoted by $FIFO_n[a]$ with a varying between 0 and $N_n-1$ with $N_n$ designating the total number of auxiliary components stored in the FIFO memory 33-$n$ (equivalently the total number of auxiliary components in the path $Path_n$). The filling the different FIFO memories 33-$n$ may depend on the order of arrival of the components of the first message and of the second message, on the computation of the auxiliary components of each path, as well as on the structure of the paths grouping the auxiliary components.

Referring to FIG. 4, two exemplary constructions of paths, while computing the auxiliary components from the first message and the second message, are shown. The computation of the auxiliary components is accordingly illustrated using a two-dimensional representation. The vertical axis designates the processed components of the first message. The horizontal axis designates the processed components of the second message. The computed auxiliary components are represented by filled circles.

Figure 4A:
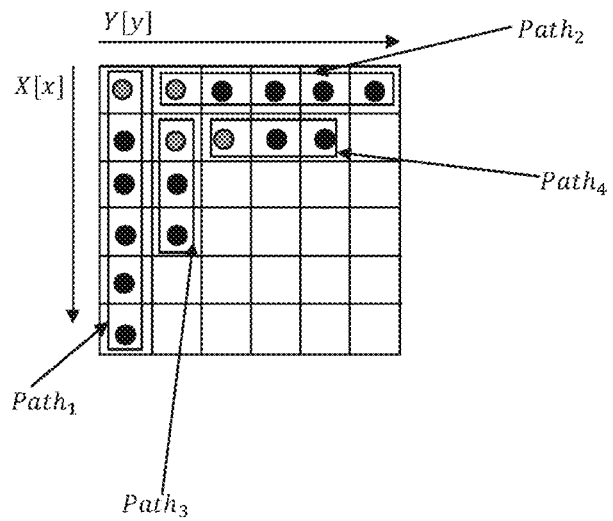
FIG. 4A and FIG. 4B illustrate two exemplary grouping of auxiliary components into paths, according to some embodiments.
Figure 4B:
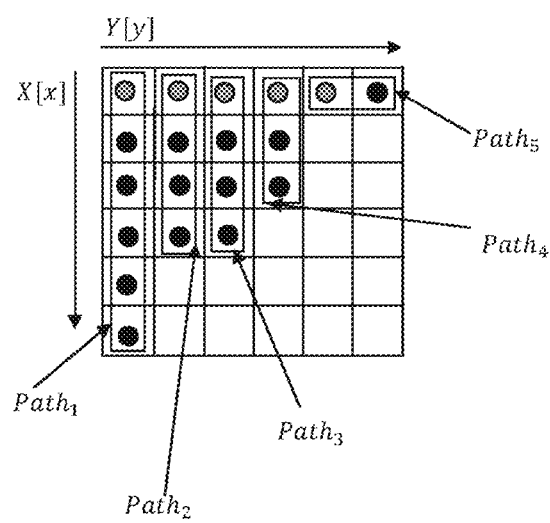

FIG. 4A depicts a first exemplary construction of four paths such that:
  the auxiliary components of the path $Path_1$ are determined from the component $Y[0]$ of the second message and from the components $X[x]$ of the first message for x varying between 0 and $n_X-1$;
  the auxiliary components of the path $Path_2$ are determined from the component $X[0]$ of the first message and from the components $Y[y]$ of the second message for y varying between 1 and $n_Y-2$;
  the auxiliary components of the path $Path_3$ are determined from the component $Y[1]$ of the second message and from the components $X[x]$ of the first message for x varying between 1 and $n_X-3$;
  the auxiliary components of the path $Path_4$ are determined from the component $X[1]$ of the first message and from the components $Y[y]$ of the second message for y varying between 2 and $n_Y-2$;

FIG. 4B depicts a second exemplary construction of five paths such that:
  the auxiliary components of the path $Path_1$ are determined from the component $Y[0]$ of the second message and from the components $X[x]$ of the first message for x varying between 0 and $n_X-1$;
  the auxiliary components of the path $Path_2$ are determined from the component $Y[1]$ of the second message and from the components $X[x]$ of the first message for x varying between 0 and $n_X-3$;
  the auxiliary components of the path $Path_3$ are determined from the component $Y[2]$ of the second message and from the components $X[x]$ of the first message for x varying between 0 and $n_X-3$;
  the auxiliary components of the path $Path_4$ are determined from the component $Y[3]$ of the second message and from the components $X[x]$ of the first message for x varying between 0 and $n_X-4$, and the auxiliary components of the path $Path_5$ are determined from the component $X[0]$ of the first message and from the components $Y[y]$ of the second message for $y$ varying between 4 and $n_Y-1$.

The two examples depicted in FIG. 4 illustrate possible constructions of the paths while computing the auxiliary components. However, the skilled person will readily understand that other path constructions may be obtained depending on the order of reception of the components of the first and the second messages. In particular, the order of reception of the components of the first and of the second messages may be taken into account, in order to compute the first elements of the FIFO memories, i.e. the elements $Path_n[0]$ for $n=1, \ldots, n_p$, as soon as possible, in order to minimize the latency of the elementary check node processor 3. It should be noted that when the first element of the FIFO is ready, the sorting process can start. In such situation, the filling the FIFO with the path and the generation of the elementary check node components of the elementary check node message E may be performed simultaneously.

The various embodiments of the disclosure provide efficient and low-complexity sorting devices implemented in the elementary check node processor 3 to determine $n_E$ elementary check node components of at least one elementary check node message by iteratively sorting the auxiliary components derived from the first and from the second messages.

To facilitate understanding of the disclosure, the following definitions are provided in connection to the notations used hereinafter in the description of some embodiments:

$n_{IT}=n_E$ designates the number of iterations of the auxiliary components sorting process, the script $it=1, \ldots, n_{IT}$ referring to the $it^{th}$ iteration of the sorting process;

$n_{MUX}=n_p$ designates a number of multiplexers used for the sorting process;

$n_{comp}=n_{MUX}$ designates a number of reliability metrics comparators used for the sorting process;

$B_{aux}^{it}=(B_{aux}^{it,\oplus}, B_{aux}^{it,+}, B_{aux}^{it,FNI})$ refers to an auxiliary component extracted from the auxiliary components at the $it^{th}$ iteration of the sorting process, the auxiliary component comprising an auxiliary symbol $B_{aux}^{it,\oplus}$, an auxiliary reliability metrics $B_{aux}^{it,+}$, and a FIFO number index $B_{aux}^{it,FNI}$ indicating the FIFO memory from which the auxiliary component at iteration it was extracted;

$B_{cand,m}^{it}=(B_{cand,m}^{it,\oplus}, B_{cand,m}^{it,+}, B_{cand,m}^{it,FNI})$ refers to a candidate elementary check node component determined by the $m^{th}$ multiplexer 34-$m$ at the $it^{th}$ iteration of the sorting process, the candidate elementary check node component comprising a candidate symbol $B_{cand,m}^{it,\oplus}$, a candidate reliability metrics $B_{cand,m}^{it,+}$ associated with said candidate symbol, and a FIFO number index $B_{cand,m}^{it,FNI}$ indicating the FIFO memory from which the candidate symbol $B_{cand,m}^{it,\oplus}$ and the candidate reliability metrics $B_{cand,m}^{it,+}$ originate;

$B_{cand,min}^{it}=B_{cand,1}^{it}=(B_{cand,1}^{it,\oplus}, B_{cand,1}^{it,+}, B_{cand,1}^{it,FNI})$ refers to the candidate elementary check node component determined by the $1^{st}$ multiplexer 34-1 at the $it^{th}$ iteration of the sorting process, the candidate elementary check node component $B_{cand,min}^{it}$ comprising the most reliable candidate symbol at the $it^{th}$ iteration of the sorting process.

Referring to FIG. 3, the elementary check node processor 3 may comprise a sorting device configured to determine the elementary check node components (more precisely a predefined number $n_E$ of elementary check node components) from the $n_B$ auxiliary components determined by the calculation unit 31 by sorting the auxiliary components during a number $n_{IT}$ of iterations according to a given order of the auxiliary reliability metrics. The sorting device may comprise a plurality $n_{MUX}=n_p$ of multiplexers 34-$m$, the multiplexers 34-$m$ for $m=1, \ldots, n_{MUX}$ being configured to perform initialization actions at a first iteration (i.e. $it=1$) of the sorting process by setting candidate elementary check node components $B_{cand,m}^{1}$ to the auxiliary component $B_m(0)= FIFO_m[0]$ stored in the FIFO memory 33-$m$ ($n=m$) and comprising the most reliable auxiliary symbol.

Accordingly, at the first iteration of the sorting process, the candidate elementary check node components $B_{cand,1}^{1}$, $B_{cand,2}^{1}, \ldots, B_{cand,n_p}^{1}$ are sorted according to a decreasing reliability of the candidate symbols corresponding to an increasing or decreasing order of the reliability metrics $B_{cand,m}^{1,+}$ for $m=1, \ldots, n_p$.

Each candidate elementary check node component $B_{cand,m}^{it}$ is assigned a FIFO number index $B_{cand,m}^{it,FNI}$, the FIFO memory number index corresponding to the number of the FIFO memory in which the candidate elementary check node component was stored.

For each next iteration $it=2, \ldots, n_{IT}$, each multiplexer 34-$m$ may be configured to:

receive an auxiliary component denoted by $B_{aux}^{it}=(B_{aux}^{it,\oplus}, B_{aux}^{it,+}, B_{aux}^{it,FNI})$ extracted from a candidate FIFO memory 33-$n$, the candidate FIFO memory being assigned as a FIFO number index the FIFO number index $B_{cand,1}^{it-1,FNI}$ comprised in the candidate elementary check node component $B_{cand,min}^{it-1}=B_{cand,1}^{it-1}$, as determined at a previous iteration and comprising the most reliable candidate symbol. This means that the auxiliary component extracted at iteration it corresponds to the next component stored in the FIFO memory 33-$n$ of a FIFO number index the FIFO number index $B_{cand,1}^{it-1,FNI}$ and may be extracted using the pull operation of FIFO memories such that the pull operation (i.e. $Pull_n=1$) is performed at the candidate FIFO memory 33-$n$ assigned the FIFO number index $n=B_{cand,1}^{it-1,FNI}$;

update the candidate elementary check node component $B_{cand,m}^{it}$ by performing a control action for selecting a component among the received auxiliary component $B_{aux}^{it}$, and the candidate elementary check node components $B_{cand,m}^{it-1}$ and $B_{cand,m+1}^{it-1}$ determined at a previous iteration by the multiplexer 34-$m$ and the multiplexer 34-$(m+1)$.

The processing of an auxiliary component at each iteration of the sorting process provides, at each iteration, $n_p$ candidate elementary check node components $B_{cand,1}^{it}$, $B_{cand,2}^{it}, \ldots, B_{cand,n_p}^{it}$, ordered according to a given order of the candidate reliability metrics such that:

the candidate elementary check node component comprising the most reliable candidate symbol is the candidate elementary check node component $B_{cand,1}^{it}$ also denoted by $B_{cand,min}^{it}=(B_{cand,min}^{it,\oplus}, B_{cand,min}^{it,+}, B_{cand,m}^{it,FNI})$, and that each $m^{th}$ candidate elementary check node component $B_{cand,m}^{it}$ comprises a candidate symbol $B_{cand,m}^{it,\oplus}$ that is more reliable than the candidate symbol $B_{cand,m+1}^{it,\oplus}$ comprised in the $(m+1)^{th}$ candidate elementary check node component $B_{cand,m+1}^{it}$.

In other words, for a decreasing (respectively increasing) order of the reliability metrics, the candidate elementary check node components determined at each iteration satisfy $B_{cand,m}^{it,+} \leq B_{cand,m+1}^{it,+}$ (respectively $B_{cand,m}^{it,+} \geq B_{cand,m+1}^{it,+}$) for $m=1, \ldots, n_p-1$.

The sorting device may be configured to determine the elementary check node components E[e] for e=0, . . . , $n_E-1$ by generating and/or selecting, at each iteration of a total of $n_{IT}=n_E$ iterations, the candidate elementary check node component $B_{cand,min}^{it}=B_{cand,1}^{it}$ comprising the most reliable candidate symbol.

After the generation of the candidate elementary check node component $B_{cand,1}^{it}$ comprising the most reliable candidate symbol at the $it^{th}$ iteration, the sorting device may be configured to determine the candidate FIFO memory to be used in the next iteration for the extraction of an auxiliary component. The candidate FIFO memory corresponds to the FIFO memory 33-$n$ from which the selected candidate elementary check node component $B_{cand,1}^{it}$ comprising the most reliable candidate symbol at the $it^{th}$ iteration originates. Accordingly, the sorting device may be further configured to determine an updated component index from the component index assigned to the selected candidate elementary check node component $B_{cand,1}^{it}$ comprising the most reliable candidate symbol at the $it^{th}$ iteration, for example by incrementing by one ('1') the component index assigned to the selected candidate elementary check node component $B_{cand,1}^{it}$. The auxiliary component to be processed at the next iteration of the sorting process thus corresponds to the auxiliary component stored in the candidate FIFO memory and assigned with the updated component index.

At the end of the processing/sorting of at least $n_E$ auxiliary components, the elementary check node message E is constructed from the selected candidate elementary check node components at the different iterations it=1, . . . , $n_E$ such that:

$$E = \begin{bmatrix} B_{cand,min}^1 \\ B_{cand,min}^2 \\ \vdots \\ B_{cand,min}^{n_E} \end{bmatrix} = \begin{bmatrix} B_{cand,1}^1 \\ B_{cand,1}^2 \\ \vdots \\ B_{cand,1}^{n_E} \end{bmatrix}.$$

The sorting device may further comprise a plurality $n_{comp}$ of reliability metrics comparators 36-$m$ with m=1, . . . , $n_p$. Each multiplexer 34-$m$ for m=1, . . . , $n_p$ may be associated with a reliability metrics comparator 36-$m$ configured to perform a reliability metrics comparison between the auxiliary reliability metrics $B_{aux}^{it,+}$ comprised in the received auxiliary component $B_{aux}^{it}$ and the candidate reliability metrics $B_{cand,m}^{it-1,+}$ comprised in the candidate elementary check node component $B_{cand,m}^{it-1}$, as determined by the multiplexer 34-$m$ at a previous iteration. Each multiplexer 34-$m$ may be configured to perform at each iteration a control action for selecting a component among the received auxiliary component and the candidate elementary check node components, determined at a previous iteration by the multiplexer 34-$m$ and the multiplexer 34-$m$+1, depending on the comparison performed by the reliability metrics comparator 36-$m$ associated with said multiplexer 34-$m$ and the comparison performed by the reliability metrics comparator 36-($m$+1) associated with the multiplexer 36-($m$+1).

In to some embodiments, the control action performed by the multiplexer 34-$m$ may be for example a keeping action, an insertion action, or a shift action. However, the skilled person will readily understand that other control actions may be performed.

For example, at each iteration it=2, . . . , $n_{IT}$, each multiplexer 34-$m$ may be configured to:

perform a keeping action by setting the candidate elementary check node component $B_{cand,m}^{it}$ to the candidate elementary check node component $B_{cand,m}^{it-1}$ determined by the multiplexer 34-$m$ at a previous iteration if it is determined that the auxiliary symbol $B_{aux}^{it,\oplus}$ comprised in the received auxiliary component $B_{aux}^{it}$ at the $it^{th}$ iteration is more reliable than the candidate symbol $B_{cand,m}^{it-1,\oplus}$ comprised in the candidate elementary check node component $B_{cand,m}^{it-1}$ determined at the previous iteration by the multiplexer 34-$m$. According to the keeping action, the multiplexer 34-$m$ may keep the candidate elementary check node component previously selected during the previous iteration as the candidate elementary check node component for the current iteration. Accordingly, the following equalities may be satisfied: $B_{cand,m}^{it,\oplus}=B_{cand,m}^{it-1,\oplus}$, $B_{cand,m}^{it,+}=B_{cand,m}^{it-1,+}$, and $B_{cand,m}^{it,FNI}=B_{cand,m}^{it-1,FNI}$;

perform an insertion action by setting the candidate elementary check node component $B_{cand,m}^{it}$ to the received auxiliary component $B_{aux}^{it}$ if it is determined that the auxiliary symbol $B_{aux}^{it,\oplus}$ comprised in the auxiliary component is less reliable than the candidate symbol $B_{cand,m}^{it-1,\oplus}$ comprised in the candidate elementary check node component $B_{cand,m}^{it-1}$ determined by the multiplexer 34-$m$ at a previous iteration and that the auxiliary symbol $B_{aux}^{it,\oplus}$ is more reliable than the candidate symbol $B_{cand,m+1}^{it-1,\oplus}$ comprised in the candidate elementary check node component $B_{cand,m+1}^{it-1}$ determined by the multiplexer 34-($m$+1) at a previous iteration. According to the insertion action: $B_{cand,m}^{it,\oplus}=B_{aux}^{it,\oplus}$, $B_{cand,m}^{it,+}=B_{aux}^{it,+}$, and $B_{cand,m}^{it,FNI}=B_{aux}^{it,FNI}$;

perform a shift action by setting the candidate elementary check node component $B_{cand,m}^{it}$ to the candidate elementary check node component $B_{cand,m+1}^{it-1}$ determined by the multiplexer 34-($m$+1) at a previous iteration if it is determined that the auxiliary symbol comprised in the received auxiliary component is less reliable than the candidate symbol comprised in the candidate elementary check node component $B_{cand,m+1}^{it-1}$ determined by the multiplexer 315-($m$+1) at a previous iteration. According to the shift action: $B_{cand,m}^{it,\oplus}=B_{cand,m+1}^{it-1,\oplus}$, $B_{cand,m}^{it,+}=B_{cand,m+1}^{it-1,+}$, and $B_{cand,m}^{it,FNI}=B_{cand,m+1}^{it-1,FNI}$.

The control actions performed by each multiplexer 34-$m$ may depend on the results of the reliability metrics comparisons performed by the reliability metrics comparator 36-$m$, associated with the multiplexer 34-$m$, and the reliability metrics comparator 36-($m$+1) associated with the multiplexer 34-($m$+1), the right-side neighbor multiplexer to the multiplexer 34-$m$. Given that the multiplexer 34-$n_p$ is the last multiplexer and does not have a right-side neighbor multiplexer, it is assumed that the reliability metrics comparison involving the candidate elementary check node component $B_{cand,m+1}^{it-1}$ when m=$n_p$ uses a candidate component $B_{cst}$ comprising a constant symbol and a constant value of the reliability metrics. Such constant value of the reliability metrics makes the result of any reliability metrics comparison between the auxiliary symbol $B_{aux}^{it,\oplus}$ and the constant reliability metrics always constant such that the candidate component $B_{cst}$ is less reliable than the auxiliary symbol $B_{aux}^{it,\oplus}$.

Figure 5:
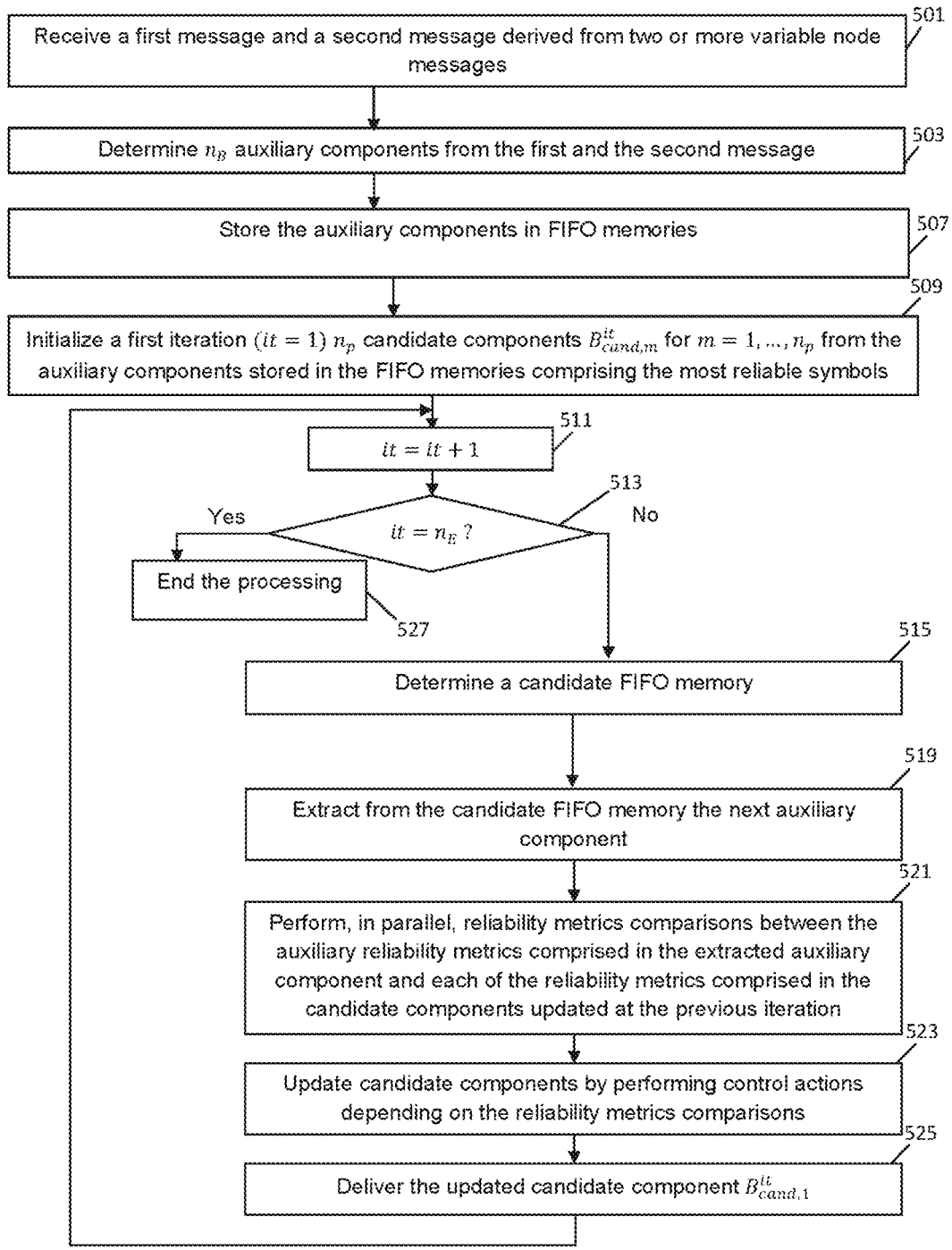
FIG. 5 is a flowchart depicting a method for determining an elementary check node message from a first message and a second message, according to some embodiments in which iterative sorting is performed.

Referring to FIG. 5, a sorting method for determining elementary check node components in an elementary check node processor implemented in a non-binary error correcting code decoder is shown. The method comprises calculating auxiliary components from a first message and from a second message derived from variable node messages and sorting said auxiliary components during a number $n_{IT}=n_E$ of iterations, an auxiliary component comprising an auxiliary symbol, an auxiliary reliability metrics, and a FIFO number index.

Accordingly, at step 501, a first message denoted by X and a second message denoted by Y derived from three or more variable node messages $U_1, \ldots, U_{d_{cn}}$ may be received.

According to some embodiments, the first message X may comprise a first given number $n_X$ of components denoted by $X[x]$ for $x=0, \ldots, n_X-1$ and the second message Y may comprise a second given number $n_Y$ of components $Y[y]$ for $y=0, \ldots, n_Y-1$.

According to some embodiments, the first message and the second message may comprise a same number of components, according to which the first given number and the second given number may be equal, i.e. $n_X=n_Y$.

In other embodiments, the first message and the second message comprise a different number of components, according to which the first given number and the second given number may be different, i.e. $n_X \neq n_Y$.

At step 503, a predefined number $n_B$ of auxiliary components designated by $B_t[x][y]=(B_t[x][y]^{\oplus}, B_t[x][y]^{+})$ for $t=1, \ldots, n_B$ may be determined from the first message X and the second message Y. More specifically, the auxiliary component $B_t[x][y]=(B_t[x][y]^{\oplus}, B_t[x][y]^{+})$ for $t=1, \ldots, n_B$ refers to the auxiliary component determined from the component $X[x]=(X[x]^{\oplus}, X[x]^{+})$ comprised in the first message X and from the component $Y[y]=[y]^{\oplus}, Y[y]^{+})$ comprised in the second message, the index x varying in $0,1, \ldots, n_X-1$ and the index y varying in $0,1, \ldots, n_Y-1$. The auxiliary component $B_t[x][y]=(B_t[x][y]^{\oplus}, B_t[x][y]^{+})$ may be a component comprising:
- an auxiliary symbol designated by $B_t[x][y]^{\oplus}$, and
- an auxiliary reliability metrics designated by $B_t[x][y]^{+}$ associated with said auxiliary symbol.

According to some embodiments, step 503 may comprise:
- determining the auxiliary symbol $B_t[x][y]^{\oplus}$ comprised in each auxiliary component $B_t[x][y]$ for $t=1, \ldots, n_B$ by applying a first addition operation over the algebraic structure of construction of the non-binary error correcting code, the first addition operation being applied to a symbol $X[x]^{\oplus}$ comprised in a component $X[x]=(X[x]^{\oplus}, X[x]^{+})$ of the first message X and a symbol $Y[y]^{\oplus}$ comprised in a component $Y[y]$ of the second message Y according to equation (4), and
- determining the auxiliary reliability metrics $B_t[x][y]^{+}$ associated with each auxiliary symbol $B_t[x][y]^{\oplus}$ by applying a second addition operation over a predefined algebraic structure, the second addition operation being applied to a reliability metrics $X[x]^{+}$ associated with a symbol $X[x]^{\oplus}$ comprised in a component $X[x]$ of the first message X and a reliability metrics $Y[y]^{+}$ associated with a symbol $Y[y]^{\oplus}$ comprised in a component $Y[y]$ of the second message Y according to equation (5).

According to some embodiments, the predefined algebraic structure over which the second addition operation is performed is chosen in a group comprising the field of real numbers, the field of integer numbers, and the field of natural numbers.

According to some embodiments, the number $n_B$ of auxiliary components may be determined depending on at least one parameter chosen in a group comprising the number of iterations $N_{iter}$ of the variable node and check node messages exchange between, the algebraic structure of construction of the non-binary error correcting code (for example the Galois field for codes constructed over Galois fields), a signal-to-noise ratio, one or both of the first predefined number of components $n_X$ of the first message X and the second predefined number of components $n_Y$ of the second message Y, and the position of the elementary check node processor within the check node processing unit.

The determined auxiliary components may be grouped into a plurality of $n_p$ paths denoted by $Path_1, \ldots, Path_{n_p}$ such that each path $Path_n=(Path_n[0], \ldots, Path_n[N_n-1])$ for $n=1, \ldots, n_p$ comprises at least one auxiliary component denoted by $Path_n[g]=(Path_n^{\oplus}[g], Path_n^{+}[g])$ for $g=0, \ldots, N_n-1$.

The auxiliary components may be grouped into the paths, according to a decreasing reliability of the auxiliary symbols such that:
- the auxiliary components comprised in each path of index n are sorted according to a decreasing reliability of the auxiliary symbols satisfying $Path_n^{+}[g] \leq Path_n^{+}[g+1]$ for $g=0, \ldots, N_n-1$, and
- the auxiliary components comprising the most reliable auxiliary symbol of each path are sorted according to a decreasing reliability of the auxiliary symbols such that $Path_1^{+}[0] \leq Path_2^{+}[0] \leq \ldots \leq Path_{n_p}^{+}[0]$.

At step 507, the auxiliary components of each path $Path_n$ may be stored in a FIFO memory 33-$n$ for $n=1, \ldots, n_p$, each FIFO memory 33-$n$ being assigned a FIFO number index FNI given by the index n varying between 1 and $n_p$ and the auxiliary components stored in each FIFO memory 33-$n$ further comprising the FIFO number index assigned to the FIFO memory 33-$n$ in which they are stored.

Steps 509 to 525 may be performed to determine $n_E$ elementary check node components $E[e]=(E[e]^{\oplus}, E[e]^{+})$ for $e=0, \ldots, n_E-1$ of an elementary check node message E from the $n_B$ auxiliary components stored in the different FIFO memories by performing $n_{IT}=n_E$ iterations.

According to some embodiments, each elementary check node component $E[e]$ may comprise a symbol $E[e]^{\oplus}$ and a reliability metrics $E[e]^{+}$ associated with said symbol, the elementary check node components being sorted according to a given order of the reliability metrics $E[e]^{+}$ such that $E[e]^{+} \leq E[e+1]^{+}$ for $e=0, \ldots, n_E-2$ and the elementary check node component comprising the most reliable symbol is $E[0]=(E[0]^{\oplus}, E[0]^{+})$.

In one embodiment, an iteration may correspond to a clock cycle.

Each iteration of the iterative sorting may provide $n_p$ candidate elementary check node components $B_{cand,m}^{it}=(B_{cand,m}^{it,\oplus}, B_{cand,m}^{it,+}, B_{cand,m}^{it,FNI})$ for $m=1, \ldots, n_p$ depending on comparisons performed between the auxiliary reliability metrics, comprised in an auxiliary component extracted from the $n_B$ auxiliary components stored in the FIFO memories and the candidate reliability metrics comprised in the candidate elementary check node components determined at the previous iteration. The candidate elementary check node components $B_{cand,1}^{it}, B_{cand,2}^{it}, \ldots, B_{cand,n_E}^{it}$ may be ordered according to a given order of the candidate reliability metrics such that:
- the candidate elementary check node component comprising the most reliable candidate symbol is the candidate elementary check node component $B_{cand,1}^{it}=B_{cand,min}^{it}$, and that
- the $m^{th}$ candidate elementary check node component $B_{cand,m}^{it}$ comprises a candidate symbol $B_{cand,m}^{it,\oplus}$ that is more reliable than the candidate symbol $B_{cand,m+1}^{it,\oplus}$ comprised in the $(m+1)^{th}$ candidate elementary check node component $B_{cand,m+1}^{it}$.

Depending on the comparisons results, control actions may be decided and performed, at each iteration, to determine candidate elementary check node components by updating the candidate components previously determined at the previous iteration.

The control action may be for example a keeping action, an insertion action, or a shift action.

At step 509, an initialization of the number of iterations of the iterative sorting process may be performed according to it=1. In embodiments in which an iteration is performed during a clock cycle, the number of iterations of the sorting process may correspond to the sorting processing time period i.e. the latency in terms of the number of clock cycles.

At step 509, initialization actions may be performed at the first iteration (it=1) of the iterative sorting process. The initialization actions may consist in setting the candidate elementary check node components $B_{cand,m}^1$ to the auxiliary component $B_m(0)=FIFO_m[0]$ stored in the FIFO memory 33-$m$ (n=m) and comprising the most reliable auxiliary symbol, the candidate elementary check node components $B_{cand,1}^1, B_{cand,2}^1, \ldots, B_{cand,n_p}^1$ being sorted according to a decreasing reliability of the candidate symbols corresponding to an increasing or decreasing order of the reliability metrics $B_{cand,m}^{1,+}$ for $m=1, \ldots, n_p$.

At step 511, the number of the iterations of the sorting process may be incremented.

At step 513, the generation of the $n_E$ elementary check node components may be controlled by checking if the number of iterations of the sorting process it reached $n_E$.

If it is determined at step 513 that it=$n_E$, this means that the desired number $n_E$ of elementary check node components has been determined. Thus, at step 527, the sorting process may be stopped and the $n_E$ elementary check node components may be delivered as the selected candidate elementary check node components $B_{cand,min}^{it}=B_{cand,1}^{it}$ selected at each iteration for it=1, ..., $n_E$ such that:

$$E = \begin{bmatrix} B_{cand,min}^1 \\ B_{cand,min}^2 \\ \vdots \\ B_{cand,min}^{n_E} \end{bmatrix} = \begin{bmatrix} B_{cand,1}^1 \\ B_{cand,1}^2 \\ \vdots \\ B_{cand,1}^{n_E} \end{bmatrix}$$

If it is determined at step 513 that it≠$n_E$, and more specifically that Δ<$n_E$, this means that the desired number of elementary check node components is not determined. Steps 515 to 525 may be performed to determine $n_E$ elementary check node components.

At step 515, a candidate FIFO memory may be determined, the candidate FIFO memory being assigned as a FIFO number index the FIFO number index $B_{cand,m}^{it-1,FNI}$ comprised in the candidate elementary check node component $B_{cand,min}^{it-1}=B_{cand,1}^{it-1}$, determined at a previous iteration and comprising the most reliable candidate symbol.

At step 519, an auxiliary component may be extracted from the candidate FIFO memory determined at step 515, the auxiliary component being the auxiliary component in the candidate FIFO memory next to the candidate elementary check node component $B_{cand,m}^{it-1}$.

At step 521, reliability metrics comparisons between the auxiliary reliability metrics $B_{aux}^{it,+}$, comprised in the received auxiliary component $B_{aux}^{it}$, and each of the candidate reliability metrics $B_{cand,m}^{it-1,+}$, comprised in the candidate elementary check node components $B_{cand,m}^{it-1}$ for $m=1, \ldots, n_p$, may be performed.

At step 523, $n_p$ candidate elementary check node components $B_{cand,m}^{it}$, for $m=1, \ldots, n_p$, may be determined by performing control actions depending on the comparisons performed at step 521.

At step 525, the updated candidate elementary check node component $B_{cand,min}^{it}=B_{cand,1}^{it}$ comprising the most reliable candidate symbol may be selected and delivered.

Figure 6:
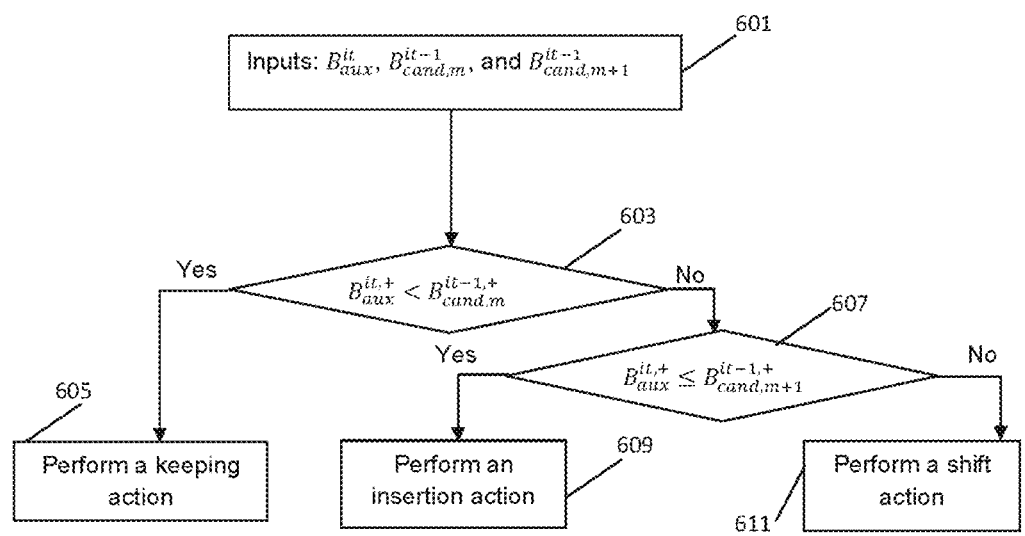
FIG. 6 is a flowchart depicting a method for performing control actions, according to some embodiments.

FIG. 6 is a flowchart illustrating the control actions performed at step 523 depending on the comparisons performed between the auxiliary reliability metrics, comprised in the received auxiliary component, and the reliability metrics, comprised in the candidate elementary check node components $B_{cand,m}^{it-1}$ for $m=1, \ldots, n_p$.

At step 601, the candidate elementary check node component $B_{cand,m}^{it-1}$, the candidate elementary check node component $B_{cand,m+1}^{it-1}$, and the auxiliary component $B_{aux}^{it}$ may be received.

Control actions may be performed at steps 605, 609, and 611 to determine, in parallel, $n_p$ candidate elementary check node components $B_{cand,m}^{it}$ depending on the results of the reliability metrics comparisons. More specifically, for each $m=1, \ldots, n_p$:

a keeping action may be performed at step 601 by setting the candidate elementary check node component $B_{cand,m}^{it}$ to the candidate elementary check node component $B_{cand,m}^{it-1}$ determined by the multiplexer 34-$m$ at a previous iteration, if it is determined at step 603 that the auxiliary symbol $B_{aux}^{it,\oplus}$ comprised in the received auxiliary component $B_{aux}^{it}$ at the $it^{th}$ iteration is more reliable than the candidate symbol $B_{cand,m}^{it-1,\oplus}$ comprised in the candidate elementary check node component $B_{cand,m}^{it-1}$ determined at the previous iteration by the multiplexer 315-$m$. According to the keeping action: $B_{cand,m}^{it,\oplus}=B_{cand,m}^{it-1,\oplus}$, $B_{cand,m}^{it,+}=B_{cand,m}^{it-1,+}$, and $B_{cand,m}^{it,FNI}=B_{cand,m}^{it-1,FNI}$;

an insertion action may be performed at step 609 by setting the candidate elementary check node component $B_{cand,m}^{it}$ to the received auxiliary component $B_{aux}^{it}$ if it is determined at step 603 that the auxiliary symbol comprised in the auxiliary component is less reliable than the candidate symbol $B_{cand,m}^{it-1,\oplus}$ comprised in the candidate elementary check node component $B_{cand,m}^{it-1}$ determined at a previous iteration and that it is determined at step 607 that the auxiliary symbol $B_{aux}^{it,\oplus}$ is more reliable than the candidate symbol $B_{cand,m+1}^{it-1,\oplus}$ comprised in the candidate elementary check node component $B_{cand,m+1}^{it-1}$ determined at a previous iteration. According to the insertion action: $B_{cand,m}^{it,\oplus}=B_{aux}^{it,\oplus}$, $B_{cand,m}^{it,+}=B_{aux}^{it,+}$, $B_{cand,m}^{it,FNI}=B_{aux}^{it,FNI}$;

a shift action may be performed at step 611 by setting the candidate elementary check node component $B_{cand,m}^{it}$ to the candidate elementary check node component $B_{cand,m+1}^{it-1}$ determined at a previous iteration if it is determined at step 607 that the auxiliary symbol comprised in the received auxiliary component is less reliable than the candidate symbol comprised in the candidate elementary check node component $B_{cand,m+1}^{it-1}$ determined at a previous iteration. According to the shift action: $B_{cand,m}^{it,\oplus}=B_{cand,m+1}^{it-1,\oplus}$, $B_{cand,m}^{it,+}=B_{cand,m+1}^{it-1,+}$, and $B_{cand,m}^{it,FNI}=B_{cand,m+1}^{it-1,FNI}$.

It should be noted that it is assumed that the comparison of step 607 has a constant 'Yes' result when performed for $m=n_p$ considering a constant candidate component $B_{cand,n_p+1}^{it-1}=B_{cst}$ comprising a constant symbol and a constant reliability metrics such that the constant candidate component is always less reliable than any auxiliary symbol $B_{aux}^{it,\oplus}$.

The methods and devices described herein may be implemented by various means. For example, these techniques may be implemented in hardware, software, or a combination thereof. For a hardware implementation, the processing elements of an iterative decoder 123 can be implemented for instance according to a hardware-only configuration (as example, in one or more FPGA, ASIC or VLSI integrated circuits with the corresponding memory) or according to a configuration using both VLSI and DSP.

While embodiments of the disclosure have been illustrated by a description of various examples, and while these embodiments have been described in considerable detail, it is not the intent of the applicant to restrict or in any way limit the scope of the appended claims to such details.

In particular, while the description of some embodiments of the disclosure has been performed with reference to a particular implementation of the EMS algorithm, it should be noted that the disclosure may be also applied to other iterative decoding algorithms such as the min-max algorithm.

Furthermore, while some embodiments of the disclosure have been described with reference to error correcting codes constructed over Galois Fields, the skilled person will readily understand that the proposed embodiments may be also applied to any non-binary LDPC codes and any non-binary graph error correcting code constructed over non-commutative groups such as polynomial codes (e.g. cyclic codes).

Further, even if the disclosure has some advantages in an application to communication systems, it should be noted that the disclosure is not limited to such communication devices and may be integrated in numerous devices such as data storage devices.

The methods described herein can be implemented by computer program instructions supplied to the processor of any type of computer to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

The invention claimed is:

1. A sorting device for determining elementary check node components in an elementary check node processor implemented in a non-binary error correcting code decoder by sorting auxiliary components, said auxiliary components being stored in a plurality of FIFO memories, each FIFO memory being assigned a FIFO number index, each auxiliary component stored in a given FIFO memory comprising an auxiliary symbol, an auxiliary reliability metrics representing the reliability of said auxiliary symbol, and the FIFO number index assigned to said given FIFO memory, the sorting device comprising a plurality of multiplexers arranged sequentially, the multiplexers being configured to initialize a set of candidate elementary check node components, each candidate elementary check node component being determined from one of the FIFO memories and corresponding to the auxiliary component which comprises the most reliable auxiliary symbol among the auxiliary components stored in said FIFO memory, said candidate elementary check node components being sorted according to the auxiliary reliability metrics of the auxiliary symbols, wherein each multiplexer is configured to perform one or more iterations of the following steps:
receive an auxiliary component extracted from the FIFO memory which is assigned the FIFO number index comprised in the candidate elementary check node component determined at the previous iteration which comprises the most reliable candidate symbol, and
update said candidate elementary check node component determined at the previous iteration by selecting one component among the received auxiliary component, the candidate elementary check node component determined at the previous iteration by said multiplexer, and the candidate elementary check node component determined at the previous iteration by the subsequent multiplexer; the sorting device being configured to determine, at each of said one or more iterations, an elementary check node component by selecting the candidate elementary check node component which comprises the most reliable candidate symbol.

2. The sorting device of claim 1, wherein the elementary check node processor is configured to receive a first message and a second message derived from two or more variable node messages, the elementary check node processor comprising a calculation unit configured to determine said auxiliary components from said first message and second message.

3. The sorting device of claim 2, wherein said first message comprises a first given number of components and said second message comprises a second given number of components, each component of the first message and the second message comprising a symbol and a reliability metrics associated with said symbol, the calculation unit being configured to determine each auxiliary component among said auxiliary components from a component comprised in said first message and a component comprised in said second message, the calculation unit being configured to:
determine the auxiliary symbol comprised in each auxiliary component by applying a first addition operation over an algebraic structure of construction of said non-binary error correcting code, said first addition operation being applied to a symbol comprised in a component of said first message and a symbol comprised in a component of said second message;
determine the auxiliary reliability metrics associated with each auxiliary symbol by applying a second addition operation over a predefined algebraic structure, said second addition operation being applied to a reliability metrics associated with a symbol comprised in a component of said first message and a reliability metrics associated with a symbol comprised in a component of said second message;
the auxiliary components stored in each FIFO memory being sorted according to a decreasing reliability of the auxiliary symbols.

4. The sorting device of claim 3, wherein the predefined algebraic structure is chosen in a group comprising the field of real numbers, the field of integer numbers, and the field of natural numbers.

5. The sorting device of claim 3, wherein the first given number of components and the second given number of components are equal.

6. The sorting device of claim 3, wherein the first given number of components and the second given number of components are different.

7. The sorting device of claim 1, wherein the elementary check node processor is implemented in a check node processing unit configured to exchange two or more variable node messages with at least one variable node processing unit implemented in said non-binary error correcting code decoder during a number of message exchange iterations, the elementary check node processor being configured to previously determine the number of said auxiliary components depending on at least one parameter chosen in a group comprising said number of message exchange iterations, an algebraic structure of construction of said non-binary error correcting code, a signal-to-noise ratio, one or more of a first predefined number of components of the first message or a second predefined number of components of the second message, and a position of the elementary check node processor within said check node processing unit.

8. The sorting device of claim 1, wherein a candidate elementary check node component comprises a candidate symbol and a candidate reliability metrics associated with said candidate symbol, each multiplexer being associated with a reliability metrics comparator configured to perform a comparison between the auxiliary reliability metrics comprised in the received auxiliary component and the candidate reliability metrics comprised in the candidate elementary check node component determined by said multiplexer at a previous iteration, each multiplexer being configured to perform a control action for selecting a component among the received auxiliary component and the candidate elementary check node components determined at a previous iteration by the multiplexer (34-$m$) and the subsequent multiplexer depending on the comparison performed by the reliability metrics comparator associated with said multiplexer (34-$m$) and the comparison performed by the reliability metrics comparator associated with the subsequent multiplexer.

9. The sorting device of claim 8, wherein each multiplexer is configured to:
perform a keeping action by setting the candidate elementary check node component to the candidate elementary check node component determined by the multiplexer at a previous iteration if it is determined that the auxiliary symbol comprised in the received auxiliary component is more reliable than the candidate symbol comprised in the candidate elementary check node component determined at the previous iteration by the multiplexer;
perform an insertion action by setting the candidate elementary check node component to the received auxiliary component if it is determined that the auxiliary symbol comprised in said auxiliary component is less reliable than the candidate symbol comprised in the candidate elementary check node component determined by the multiplexer at a previous iteration and that said auxiliary symbol is more reliable than the candidate symbol comprised in the candidate elementary check node component determined by the subsequent multiplexer at a previous iteration;
perform a shift action by setting the candidate elementary check node component to the candidate elementary check node component determined by the subsequent multiplexer at a previous iteration if it is determined that the auxiliary symbol comprised in the received auxiliary component is more reliable than the candidate symbol comprised in the candidate elementary check node component determined by the subsequent multiplexer at a previous iteration.

10. A sorting method for determining elementary check node components in an elementary check node processor implemented in a non-binary error correcting code decoder by sorting auxiliary components, said auxiliary components being stored in a plurality of FIFO memories, each FIFO memory being assigned a FIFO number index, each auxiliary component stored in a given FIFO memory comprising an auxiliary symbol, a reliability metrics representing the reliability of said auxiliary symbol, and the FIFO number index assigned to said given FIFO memory, the sorting method comprises performing by a plurality of multiplexers initialization of a set of candidate elementary check node components, each candidate elementary check node component being determined from one of the FIFO memories and corresponding to the auxiliary component which comprises the most reliable auxiliary symbol among the auxiliary components stored in said FIFO memory, said candidate elementary check node components being sorted according to the reliability metrics of the auxiliary symbols, wherein the method comprises performing, by each multiplexer, one or more iterations of the following steps:
receiving an auxiliary component extracted from the FIFO memory which is assigned the FIFO number index comprised in the candidate elementary check node component determined at the previous iteration which comprises the most reliable candidate symbol, and
updating said candidate elementary check node component determined at the previous iteration by selecting one component among the received auxiliary component, the candidate elementary check node component determined at the previous iteration by said multiplexer, and the candidate elementary check node component determined at the previous iteration by the subsequent multiplexer;
the method further comprises determining, at each of said one or more iterations, an elementary check node component by selecting the candidate elementary check node component which comprises the most reliable candidate symbol.

* * * * *